(12) United States Patent
Lee et al.

(10) Patent No.: US 10,985,177 B2
(45) Date of Patent: Apr. 20, 2021

(54) METHOD OF MANUFACTURING A SEMICONDUCTOR DEVICE HAVING NON-OVERLAPPING SLITS AT ONE SIDE OF THE CHANNEL LAYERS OF A MEMORY BLOCK

(71) Applicant: SK hynix Inc., Icheon-si (KR)

(72) Inventors: Ki Hong Lee, Suwon-si (KR); Seung Ho Pyi, Seongnam-si (KR); In Su Park, Cheongju-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/366,857

(22) Filed: Mar. 27, 2019

(65) Prior Publication Data

US 2019/0221582 A1 Jul. 18, 2019

Related U.S. Application Data

(63) Continuation of application No. 15/937,430, filed on Mar. 27, 2018, now Pat. No. 10,290,651, which is a (Continued)

(30) Foreign Application Priority Data

Nov. 14, 2012 (KR) .......................... 10-2012-0128765

(51) Int. Cl.
*H01L 27/11582* (2017.01)
*H01L 27/11551* (2017.01)
(Continued)

(52) U.S. Cl.
CPC .... *H01L 27/11582* (2013.01); *H01L 23/5226* (2013.01); *H01L 27/11519* (2013.01); (Continued)

(58) Field of Classification Search
CPC ......... H01L 27/11582; H01L 27/11556; H01L 27/11515; H01L 27/11565; H01L 27/11521; H01L 27/11568; H01L 27/11524; H01L 27/1157; H01L 27/11519; H01L 27/11551; H01L 27/11578
See application file for complete search history.

(56) References Cited

U.S. PATENT DOCUMENTS 8,008,710 B2   8/2011   Fukuzumi et al.
8,405,141 B2   3/2013   Matsuda et al.
(Continued)

FOREIGN PATENT DOCUMENTS

CN   102760738 A   10/2012
CN   102769018 A   11/2012
(Continued)

*Primary Examiner* — Younes Boulghassoul
(74) *Attorney, Agent, or Firm* — William Park & Associates Ltd.

(57) ABSTRACT

A semiconductor device includes a first conductive layer, at least one first slit through the first conductive layer, and configured to divide the first conductive layer in the unit of a memory block, second conductive layers stacked on the first conductive layer, and a second slit through the second conductive layers at a different location from the first slit and configured to divide the second conductive layers in the unit of the memory block.

17 Claims, 24 Drawing Sheets

Related U.S. Application Data continuation of application No. 14/623,943, filed on Feb. 17, 2015, now Pat. No. 9,966,384, which is a continuation of application No. 13/846,461, filed on Mar. 18, 2013, now Pat. No. 8,987,908.

(51) Int. Cl.

| | | |
|---|---|---|
| *H01L 27/11556* | (2017.01) | |
| *H01L 27/11519* | (2017.01) | |
| *H01L 27/11565* | (2017.01) | |
| *H01L 29/792* | (2006.01) | |
| *H01L 23/522* | (2006.01) | |

(52) U.S. Cl.
CPC .. *H01L 27/11551* (2013.01); *H01L 27/11556* (2013.01); *H01L 27/11565* (2013.01); *H01L 29/7926* (2013.01); *H01L 2924/0002* (2013.01)

(56) References Cited

U.S. PATENT DOCUMENTS

| | | |
|---|---|---|
| 2010/0207190 A1 | 8/2010 | Katsumata et al. |
| 2010/0232224 A1 | 9/2010 | Maeda et al. |
| 2010/0237400 A1 | 9/2010 | Aoyama |
| 2011/0180866 A1 | 7/2011 | Matsuda et al. |
| 2012/0068253 A1 | 3/2012 | Oota et al. |
| 2012/0099379 A1 | 4/2012 | Chu |
| 2012/0273865 A1 | 11/2012 | Lee et al. |
| 2013/0009229 A1* | 1/2013 | Lee ................ H01L 29/66833 257/314 |
| 2013/0009235 A1* | 1/2013 | Yoo ................ H01L 29/7926 257/329 |
| 2013/0062683 A1 | 3/2013 | Fukuzumi et al. |
| 2013/0083601 A1 | 4/2013 | Liu et al. |
| 2013/0154055 A1* | 6/2013 | Park ................ H01L 27/0805 257/532 |
| 2013/0193503 A1 | 8/2013 | Lee et al. |
| 2013/0215684 A1* | 8/2013 | Oh ................ H01L 27/11582 365/185.29 |
| 2013/0320424 A1 | 12/2013 | Lee et al. |
| 2014/0138765 A1 | 5/2014 | Lee et al. |

FOREIGN PATENT DOCUMENTS

| | | |
|---|---|---|
| KR | 101080521 B1 | 11/2011 |
| KR | 101153642 B1 | 6/2012 |
| KR | 1020130136249 A | 12/2013 |

\* cited by examiner

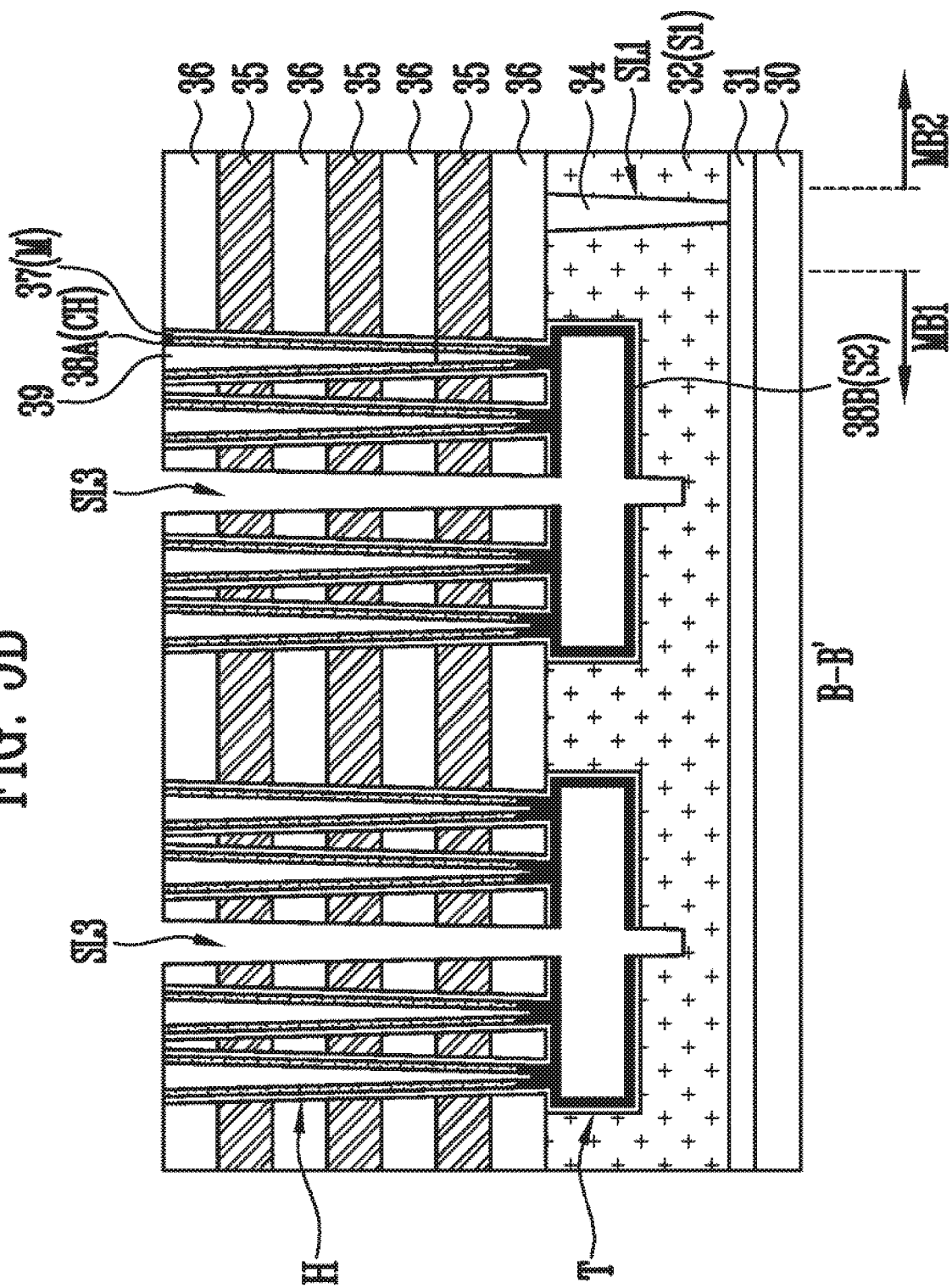

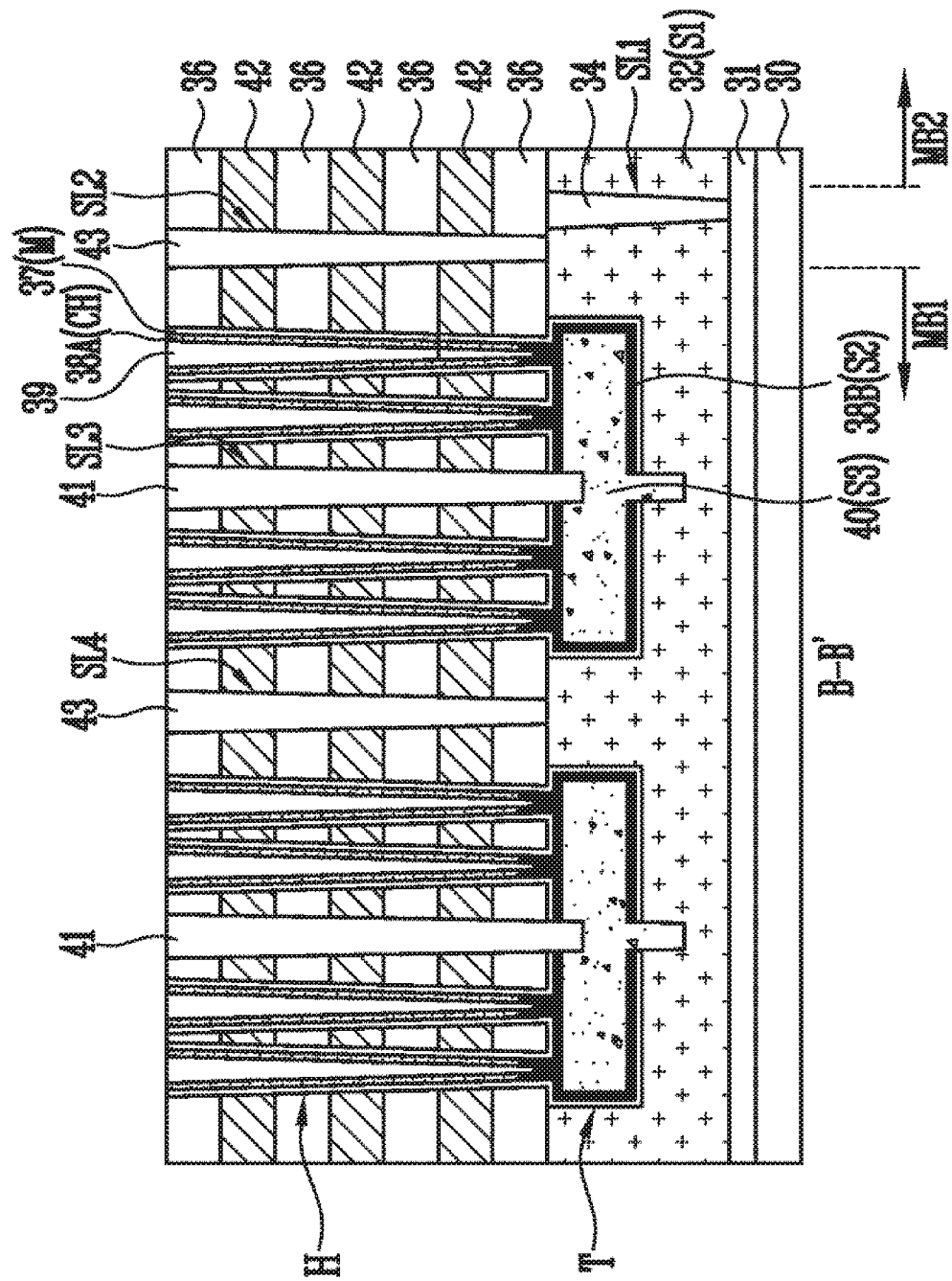

US 10,985,177 B2

METHOD OF MANUFACTURING A SEMICONDUCTOR DEVICE HAVING NON-OVERLAPPING SLITS AT ONE SIDE OF THE CHANNEL LAYERS OF A MEMORY BLOCK

CROSS-REFERENCE TO RELATED APPLICATION

The present application is a continuation application for U.S. patent application Ser. No. 15/937,430 filed Mar. 27, 2018, which is a continuation application for U.S. patent application Ser. No. 14/623,943 filed Feb. 17, 2015, which is a continuation application for U.S. patent application Ser. No. 13/846,461 filed Mar. 18, 2013, and claims priority to Korean Patent Application No. 10-2012-0128765 filed Nov. 14, 2012, the contents of which are incorporated herein by reference in its entirety.

BACKGROUND

1. Technical Field

The present invention generally relates to a semiconductor device and a method of manufacturing the same, more particularly relates to a three-dimensional non-volatile memory device and a method of manufacturing the same.

2. Related Art

A non-volatile memory device remains stored data though supplying of a power is stopped. Recently, a three-dimensional non-volatile memory device, where memory cells are vertically stacked on a silicon substrate, has been developed accordingly as there is a limit to enhance integrity of a two-dimensional non-volatile memory device where memory cells are formed with a single layer on a silicon substrate.

The three-dimensional non-volatile memory device stacks the memory cells by disposing strings with a line shape or U shape. However, since the level of difficulty of a process of stacking word lines is high, a problem exists in that the stack material becomes sloped or the conductive material remains at an undesired area and so on.

SUMMARY OF THE INVENTION

Embodiments of the present invention provide for manufacturing a semiconductor device more easily and a method of manufacturing the same.

A semiconductor device according to an embodiment of the present invention may include a first conductive layer; one or more first slit through the first conductive layer, and configured to divide the first conductive layer in the unit of a memory block; second conductive layers stacked on the first conductive layer; and a second slit through the second conductive layers at a different location from the first slit and configured to divide the second conductive layers in the unit of the memory block.

A semiconductor device according to an embodiment of the present invention may include a first source layer; at least one first slit through the first source layer, and configured to divide the first source layer in the unit of a memory block; conductive layers stacked on the first source layer; and one or more second slit through the conductive layers at different location from the first slit, and configured to divide the conductive layers in the unit of the memory block.

A method of manufacturing a semiconductor device according to an embodiment of the present invention may include forming at least one first slit through a first conductive layer, the first slit dividing the first conductive layer in the unit of a memory block; forming a first insulating layer in the first slit; forming first material layers and second material layers in turn on the first conductive layer; and forming at least one second slit through the first material layers and the second material layers, the second slit dividing the first and the second material layers in the unit of the memory block at different location from the first slit.

The present invention may lower the level of difficulty of a process of manufacturing a semiconductor device and enhance operation reliability of the semiconductor device.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1A:
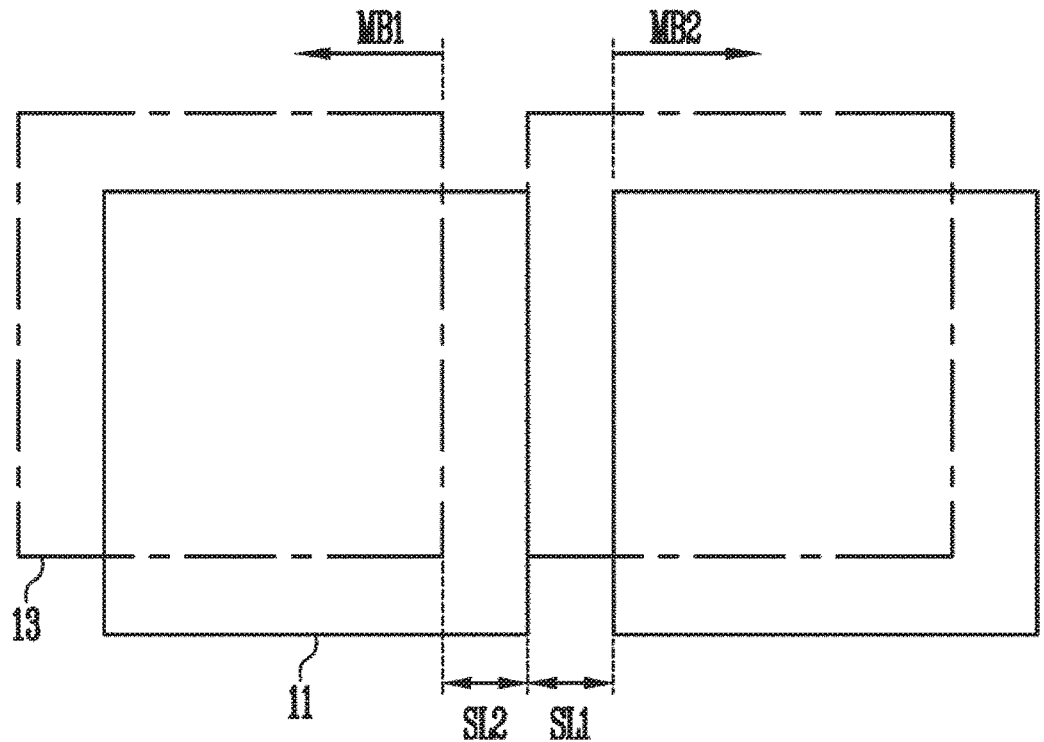
FIG. 1a and FIG. 1b are views illustrating a layout and a cross-section of a semiconductor device according to an embodiment of the present invention.
Figure 1B:
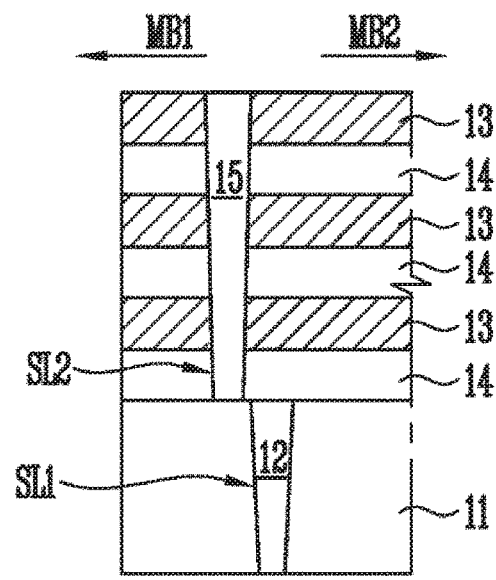

FIG. 1a and FIG. 1b are views illustrating a layout and a cross-section of a semiconductor device according to an embodiment of the present invention. FIG. 1a shows only the boundary between adjoining memory blocks for convenience of description.

In FIG. 1a and FIG. 1b, a semiconductor device of the present embodiments may include a first conductive layer 11 and second conductive layers 13 and interlayer dielectric layers 14 stacked in turn. Additionally, the semiconductor device may further include at least one first slit SL1 for dividing the first conductive layer 11 in the unit of a memory block MB1, MB2 through the first conductive layer 11, a first insulating layer 12 filled in the first slit SL1, one or more second slits SL2 for dividing the second conductive layer 13 in the unit of the memory block MB1, MB2 through the second conductive layer 13, and a second insulating layer 15 filled in the second slit SL2.

Here, the first conductive layer 11 may be a pipe gate, at least one of an uppermost second conductive layer 13 may be a selection line, and the other second conductive layers 13 may be a word line. In other embodiments, the first conductive layer 11 may be a source layer, at least one of the uppermost second conductive layer 13 may be an upper selection line, at least one of a lowermost second conductive layer 13 may be a lower selection line, and the other second conductive layers 13 may be the word line.

In the above structures, the first conductive layer 11 and the second conductive layer 13 are divided in the unit of the memory block MB1, MB2 by the first slit SL1 and the second slit SL2 located differently, the second conductive layer 13 located over the first conductive layer 11. Especially, the first slit SL1 and the second slit SL2 located at a boundary of a first memory block MB1 and a second memory block MB2 are staggered with each other. That is, the first slit SL1 and the second slit SL2 are not overlapped.

Figure 2A:
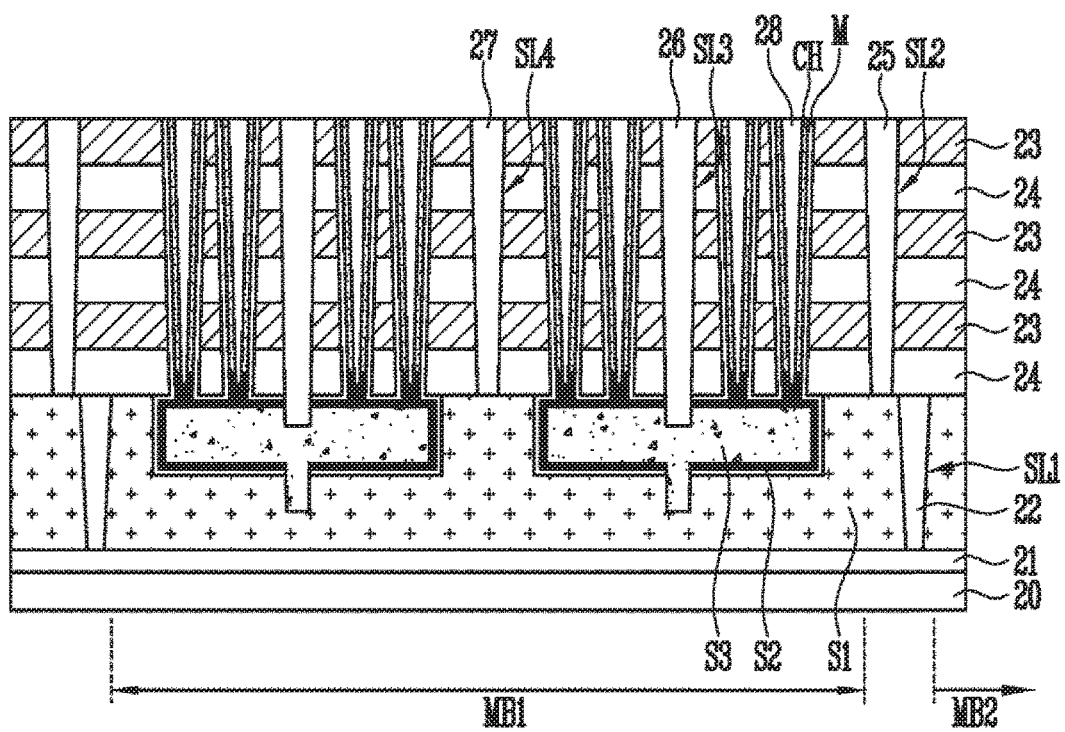
FIG. 2a is a sectional view illustrating a semiconductor device according to first embodiments of the present invention.

FIG. 2a is a sectional view illustrating a semiconductor device according to first embodiments of the present invention.

In FIG. 2a, a semiconductor device of the present embodiments may include a substrate 20, an insulating layer 21 formed on the substrate 20, a first source layer S1 formed on the insulating layer 21, at least one second source layer S2 formed in the first source layer S1, conductive layers 23 stacked on the first source layer S1, channel layers CH connected to the second source layer S2 through the conductive layers 23, a memory layer M surrounding outer surfaces of the channel layers CH and the second source layer S2, and one or more third source layers S3 connected to the first source layer S1 through the second source layer S2 and the memory layer M. The third source layer S3 is formed in the second source layer S2.

Interlayer dielectric layers 24 are formed between the stacked conductive layers 23. The channel layers CH may have a tube structure in which central area of the channel layers CH is opened, or have a pillar structure in which the channel layers CH is wholly filled with certain material. In the event that the channel layers CH have the tube structure, the opened central area is filled with an insulating layer 28.

The first source layer S1 and the second source layer S2 may be formed with a doped poly-silicon layer, and the third source layer S3 may be formed with a metal layer such as tungsten, etc. That is, a part of the source layers is formed with the metal layer, and thus a source resistance may reduce.

At least one of an uppermost conductive layer 23 may be an upper selection line, at least one of a lowermost conductive layers 23 may be a lower selection line, and the other conductive layers 23 may be word lines. As a result, a string may be vertically disposed, and so integrity of the memory device may be enhanced.

The memory layer may include a tunnel insulating layer, a charge storage layer and an charge blocking layer, or include some of the layers. Here, the charge storage layer may include one or more of a floating gate such as poly-silicon layer, etc., a trap layer such as a nitride layer, etc. and a nanodot. The floating gate stores charges and the trap layer traps charges. The memory layer may include a phase change material layer instead of the charge storage layer.

The semiconductor device may include further new memory layer (not shown) located between the memory layer and the conductive layer 23 and surrounding an upper surface and a lower surface of the conductive layer 23. Here, the new memory layer may include a tunnel insulating layer, an charge storage layer and an charge blocking layer, or include some of the layers. The charge blocking layer of the new memory layer may be a stack layer of an oxide layer and a material layer having high dielectric constant.

The semiconductor device may include further a first slit SL1 through the first source layer S1 and second slits SL2 through the conductive layers 23 and the interlayer dielectric layers 24. Here, the first slit SL1 divides the first source layer S1 in the unit of the memory block MB1, MB2, and the second slit SL2 divides the conductive layers 23 in the unit of the memory block MB1, MB2. The first slit SL1 and the second slit SL2 are located at a boundary of adjoining memory blocks MB1 and MB2, and are each disposed at different locations not to be overlapped. The first slit SL1 and the second slit SL2 are filled with an insulating layer 22 and an insulating layer 25, respectively.

The semiconductor device may include, further, at least one third slit SL3 located in a cell area of respective the memory blocks MB1 and MB2, the third slit SL3 having a depth to pass through the second slit S2 and the memory layer M. Here, the third slit SL3 may be located between the channel layers CH sharing one second source layer S2, and may have depth to expose the first source layer S1. A lower area of the third slit SL3 is filled with the third source layer S3, and the other area of the third slit SL3 is filled with an insulating layer 26.

The semiconductor device may further include one or more fourth slits SL4 located in the cell area of respective memory blocks MB1 and MB2, the fourth slit SL4 having depth to pass through the conductive layers 23. Here, the fourth slit SL4 may be located between the channel layers CH which do not share the second source layer S2, and have depth to expose the first source layer S1. The fourth slit SL4 is filled with an insulating layer 27.

The semiconductor device may further include fifth slits (not shown) located in a contact area of respective memory blocks MB1 and MB2. Here, the fifth slits may have one or more of line shape, a line shape including at least one projecting part, "c" shape, "c" shape and line shapes having at least one projecting part, or have a combination of the shapes. The fifth slits are filled with an insulating layer.

Figure 2B:
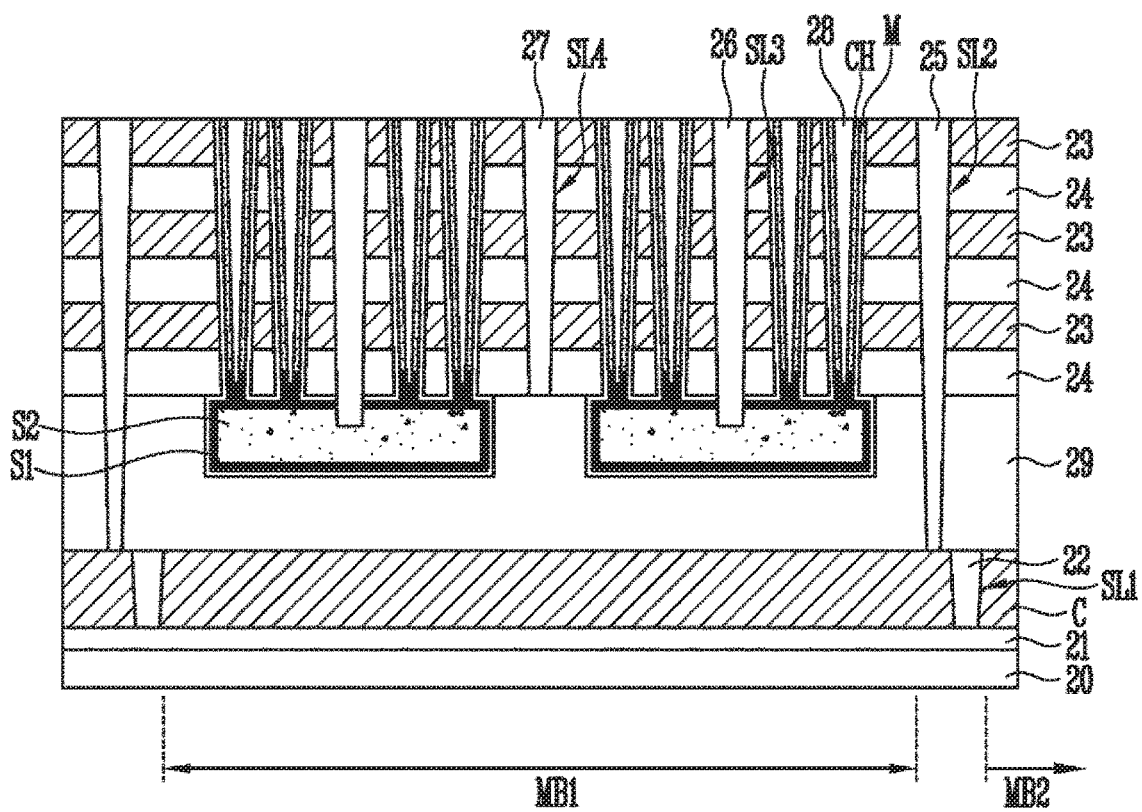
FIG. 2b is a sectional view illustrating a semiconductor device according to second embodiments of the present invention.

FIG. 2b is a sectional view illustrating a semiconductor device according to second embodiments of the present invention. Hereinafter, the same or similar description as in FIG. 2a will be omitted.

In FIG. 2b, a semiconductor device of the present embodiments may include a substrate 20, an insulating layer 21 formed on the substrate 20, a first conductive layer C formed on the insulating layer 21, an insulating layer 29 formed on the first conductive layer C and second conductive layers 23 stacked on the insulating layer 29. The semiconductor device may further include a first source layer S1 formed in the insulating layer 29, channel layers CH connected to the first source layer S1 through the second conductive layers 23, a second source layer S2 formed in the first source layer S1, and a memory layer M surrounding external surfaces of the channel layers CH and the first source layer S1.

The semiconductor device may further include a first slit SL1 through the first conductive layer C and a second slit SL2 through the second conductive layers 23, interlayer dielectric layers 24 and an insulating layer 29.

Here, the first conductive layer C is used as an etch stop layer when the second slit SL2 is formed. The first conductive layer C formed in a peripheral circuit area of the semiconductor device is used as a gate electrode of a transistor, which is not shown. For example, the insulating layer 21 and the first conductive layer C are formed in sequence on the substrate 20 including a cell area and the peripheral circuit area. Subsequently, the first slit SL1 is formed by etching the first conductive layer C. As a result, the gate electrode of the transistor is formed in the peripheral circuit area, and the first conductive layer C in the cell area is divided in the unit of the memory block MB1, MB2.

The first source layer S1 is formed along an internal surface of a trench formed in the insulating layer 29. In the event that the third slit SL3 has depth to pass through the trench, the insulating layer 29 may contact with the second source layer S2 through the first source layer S1 and the memory layer M.

Figure 2C:
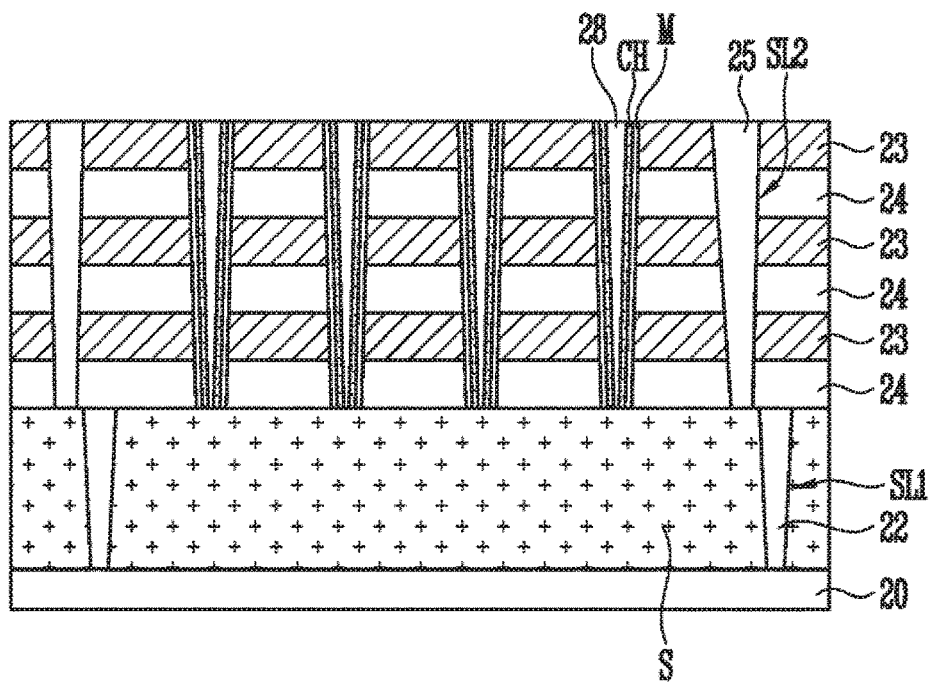
FIG. 2c is a sectional view illustrating a semiconductor device according to third embodiments of the present invention.

FIG. 2c is a sectional view illustrating a semiconductor device according to third embodiments of the present invention. Hereinafter, the same or similar description as in FIG. 2a and FIG. 2b will be omitted.

In FIG. 2c, a semiconductor device of the present embodiments may include a source layer S, conductive layers 23 stacked in tune on the source layer S, channel layers CH connected to the source layer S through the conductive layers 23, and a memory layer M surrounding external surfaces of the channel layers CH.

Here, the source layer S may be formed by injecting impurities in the substrate 20, or be formed with extra conductive layer. Interlayer dielectric layers 24 located between the stacked conductive layers 23, and opened central area of the channel layers 23 having a tube structure is filled with an insulating layer 28. At least one of an uppermost conductive layer 23 may be an upper selection line, at least one of lowermost conductive layer 23 may be a lower selection line, and the other conductive layers 23 may be word lines.

The semiconductor device may further include a first slit SL1 through the source layer S and second slits SL2 through the conductive layers 23 and the interlayer dielectric layers 24. Here, the first slit SL1 and the second slits SL2 are filled with an insulating layer 22 and an insulating layer 25, respectively.

Figure 2D:
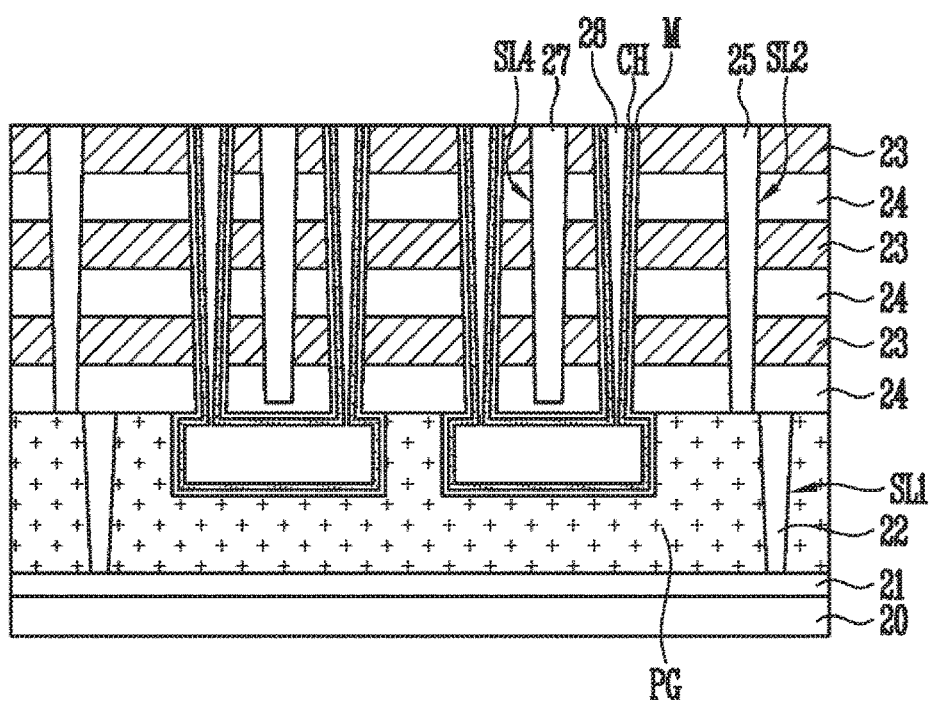
FIG. 2d is a sectional view illustrating a semiconductor device according to fourth embodiments of the present invention.

FIG. 2d is a sectional view illustrating a semiconductor device according to fourth embodiments of the present invention. Hereinafter, the same or similar description as in FIG. 2a to FIG. 2c will be omitted.

In FIG. 2d, a semiconductor device of the present embodiments may include a substrate 20, an insulating layer 21 formed on the substrate 20, a pipe gate PG formed on the insulating layer 21, conductive layers 23 stacked on the pipe gate PG, channel layers CH through the conductive layers 23 and a memory layer M surrounding outer surfaces of the channel layers CH. The semiconductor device may further include a protection layer (not shown) formed on the pipe gate PG. Here, the protection layer may be a poly-silicon layer.

The channel layer CH may include a pipe channel layer formed in the pipe gate PG and vertical channel layers connected to the pipe channel layer. The channel layer CH may substantially have U shape, W shape, etc. according to the number of the vertical channel layers connected to the pipe channel layer.

At least one of an uppermost conductive layer 23 may be a selection line, and the other conductive layers 23 may be a word line. As a result, a string may have three-dimensional structure such as U shape, etc., and so integrity of the memory device may be enhanced.

The semiconductor device may further include a first slit SL1 through the pipe gate PG and second slits SL2 through the conductive layers 23 and interlayer dielectric layers 24. Here, the first slit SL1 divides the pipe gate PG in the unit of the memory block MB1, MB2, and the second slit SL2 divides the conductive layers 23 in the unit of the memory block MB1, MB2. The first slit SL1 and the second slit SL2 are filled with an insulating layer 22 and an insulating layer 25, respectively.

The semiconductor device may further include at least one fourth slit SL4 located in a cell area of respective memory blocks MB1, MB2, particularly located between the vertical channel layers sharing one pipe channel layer. Here, the fourth slit SL4 may have depth to pass through the conductive layers 23. The fourth slit SL4 is filled with an insulating layer 26.

FIG. 3a to FIG. 8b are views illustrating a method of manufacturing a semiconductor memory device according to first embodiments of the present invention. (a) in FIGs shows layout, and (b) in FIGs illustrates cross section. Hereinafter, the same or similar description as in FIG. 2a to FIG. 2d will be omitted.

Figure 3A:
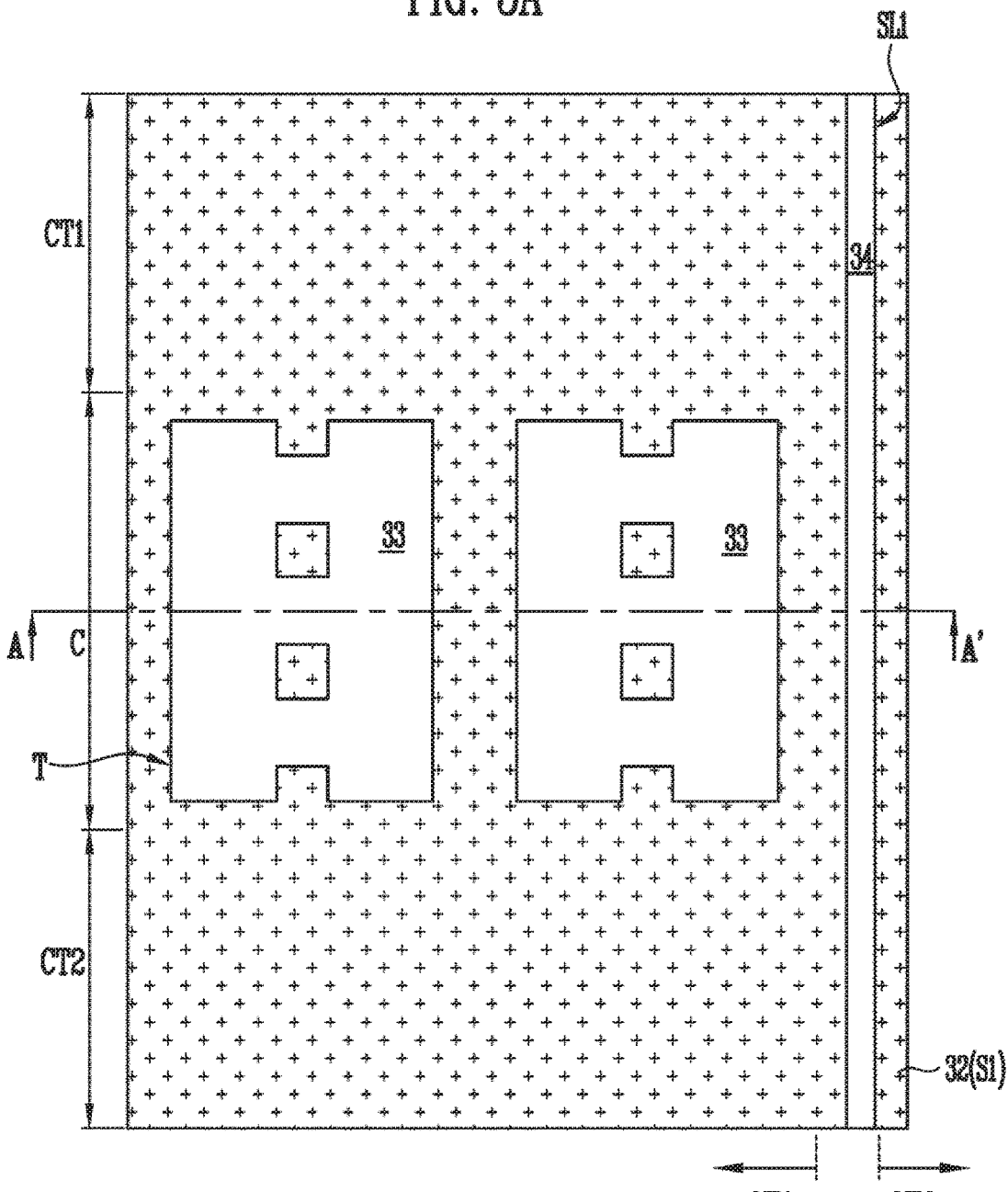
FIG. 3a to FIG. 8b are views illustrating a method of manufacturing a semiconductor memory device according to first embodiments of the present invention.
Figure 3B:
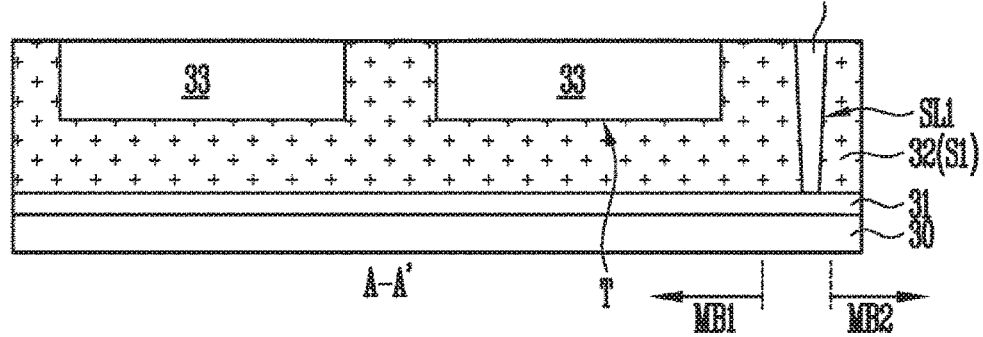

In FIG. 3a and FIG. 3b, an insulating layer 31 is formed on a substrate 30, and then a conductive layer is formed on the insulating layer 31. Here, the insulating layer 31 separates electrically a first source layer 32 from the substrate 30, and may be formed with oxide layer. The conductive layer may be a poly-silicon layer in which impurities are doped, for example a poly-silicon layer in which N-type or P-type impurities are doped. The conductive layer may be a pipe gate or a source layer. Hereinafter, it is assumed that the conductive layer is the first source layer 32.

Subsequently, trenches T are formed by etching the first source layer 32. Each of the trenches T defines an area where a second source layer and a third source layer are to be formed in following process, and locates in a cell area C of respective memory blocks MB1 and MB2. Here, each of the memory blocks MB1 and MB2 includes the cell area C and contact areas CT1 and CT2 located at both of sides or one side of the cell area C. The cell area C means an area where memory cells are to be formed, and the contact areas CT1 and CT2 indicate an area where contact pad of stacked word lines or selection lines is located.

Each of the trenches T may be formed with island shape, line shape or combination of the shapes. In FIGs, the trench T has ladder shape including line trenches and island trenches connecting the line trenches.

Next, a sacrificial layer 33 is formed in each of the trenches T. In an embodiment, the sacrificial layer 33 may be made up of a nitride SiN layer or a titanium nitride TiN layer.

Subsequently, one or more first slit SL1 for exposing the insulating layer 31 is formed by etching the first source layer 32. The first slit SL1 locates at a boundary of adjoining first memory block MB1 and second memory block MB2, and divides the first source layer 32 in the unit of the memory block MB1, MB2. Next, the first slit SL1 is formed with an insulating layer 34. In an embodiment, the insulating layer 34 may be an oxide layer, etc.

It is possible to form the trench T after the first slit SL1 is formed with the insulating layer 34.

Figure 4A:
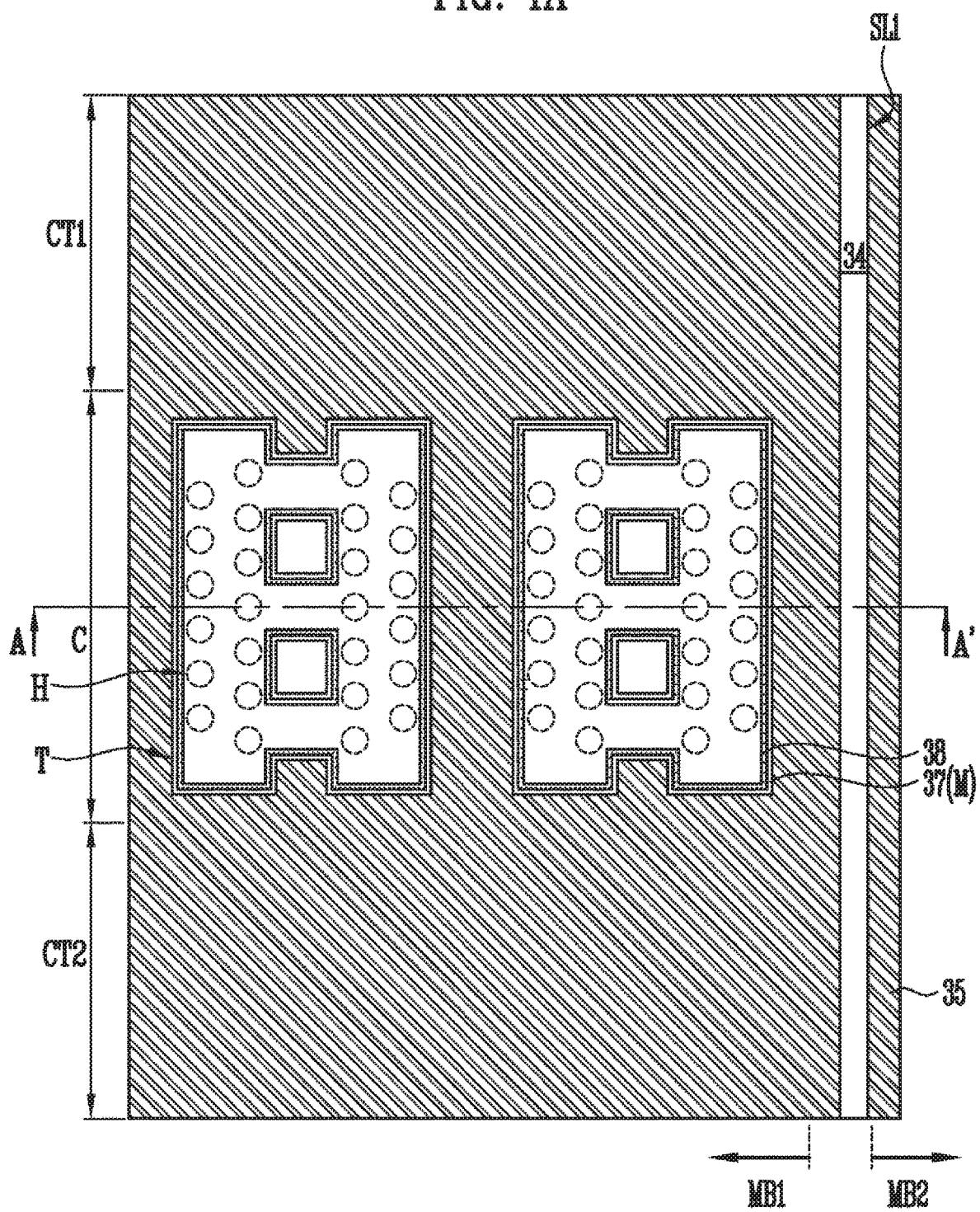
Figure 4B:
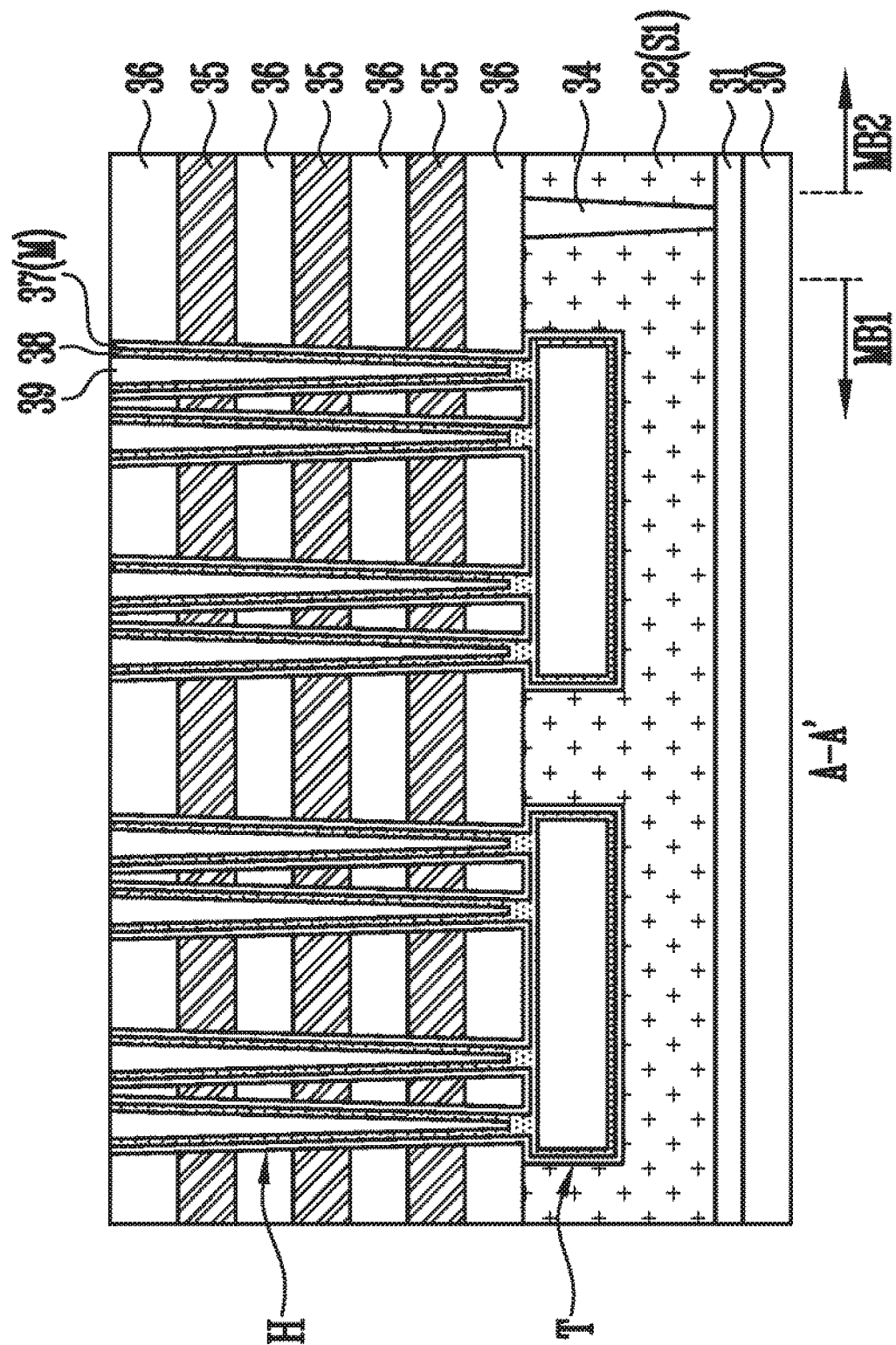

In FIG. 4a and FIG. 4b, first material layers 35 and second material layers 36 are formed in turn on the first source layer 32 filled with the insulating layer 34. The first material layer 35 is used for forming a conductive layer for a word line or a selection line, and the second material layer divides stacked conductive layers. The thickness of the first material layers 35 may be varied depending on usage of the first material layers 35, and the thickness of the first material layer 35 for the selection line may have substantially the same as or higher than that of the first material layer 35 for the word line.

The first material layer 35 and the second material layer 36 are formed with material having high etch selectivity. In an embodiment, the first material layer 35 may be formed with a conductive layer such as a poly-silicon layer, etc., and the second material layer 36 may be formed with an insulating layer such as an oxide layer, etc. In other embodiments, the first material layer 35 may be formed with a conductive layer such as a doped poly-silicon layer, a doped amorphous silicon layer, etc., and the second material layer 36 may be formed with a sacrificial layer such as an undoped poly-silicon layer, an undoped amorphous silicon layer, etc. In other embodiments, the first material layer 35 may be formed with a sacrificial layer such as a nitride layer, etc., and the second material layer 36 may be formed with an insulating layer such as an oxide layer, etc.

Hereinafter, it is assumed that the first material layer 35 is formed with the sacrificial layer and the second material layer 36 is formed with the insulating layer.

Subsequently, channel holes H connected to the trench T are formed by etching the first material layers 35 and the second material layers 36. Here, width of the channel holes H may get narrower at lower part of the channel holes H. The channel holes H may be disposed with matrix shape or be disposed staggered. FIG. 4a and FIG. 4b show four channel holes H located on the same section for convenience of description. The number of the channel holes H connected to each of the trenches T may be varied according to integrity of the memory device.

Next, a memory layer 37 is formed along internal surfaces of the trench T and the channel holes H after a sacrificial layer 33 exposed at a lower surface of the channel holes H is removed. The memory layer 37 is used for storing data, and may include an charge blocking layer, an charge storage layer and a tunnel insulating layer, or a part of the layers.

Subsequently, a semiconductor layer 38 is formed on the memory layer 37. For example, the semiconductor layer 38 may be formed with a poly-silicon layer where impurities are not doped.

Since width of the channel holes H become narrower at the lower part of the channel holes H, a connection part of the trench T and the channel holes H is completely sealed before the trench T is wholly filled with the semiconductor layer 38. Accordingly, empty space is formed in the trench T. The channel holes H may not be wholly filled with the semiconductor layer 38, and central area of the channel holes H may be opened. In this case, the insulating layer 39 is formed in the opened central area of the semiconductor layer 38.

Figure 5A:
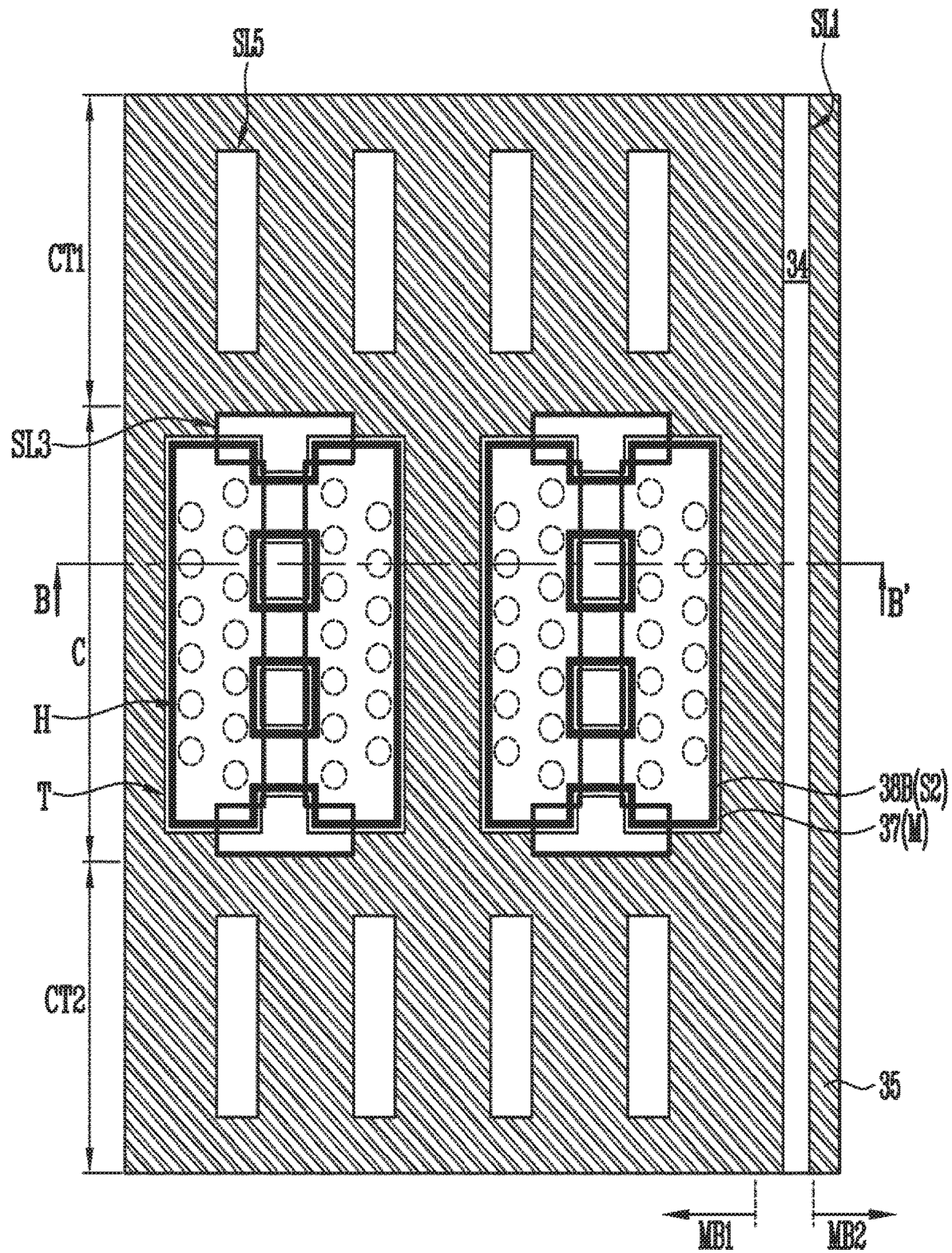

In FIG. 5a and FIG. 5b, third slits SL3 are formed through each of the trenches T. For example, the third slit SL3 is formed by etching deeply a part of the first source layer 32 after etching the first material layers 35, the second material layers 36, the memory layer 37 and the semiconductor layer 38. The third slit SL3 may be located at the central area of the trench T, and substantially have an I shape accordingly as the width of its ends are expanded.

Fifth slits SL5 in the contact areas CT1 and CT2 of respective memory blocks MB1 and MB2 may be formed with the third slit SL3 when the third slit SL3 is formed. For example, the fifth slits SL5 may substantially have a line shape extended in one direction. In the event that the first source layer 32 is formed with an insulating layer, the third slit SL3 may be formed with depth to be connected to the trench T.

Next, a second source layer 38B is formed by doping impurities in the semiconductor layer 38 in the trench T through the third slit SL3. For example, the second source layer 38B is formed by doping N-type impurities in the semiconductor layer 38 in the trench T through a plasma doping process. In other examples, an oxide layer where impurities are doped is formed on the semiconductor layer 38, the second source layer 38B is formed by diffusing the impurities in the oxide layer to the semiconductor layer 38 through a heat treatment process, and then the oxide layer is removed. As a result, a horizontal area formed in the trench T of the semiconductor layer 38 becomes the second source layer 38B, and a vertical area through stack layers of the semiconductor layer 38 becomes a channel layer 38A.

Figure 6A:
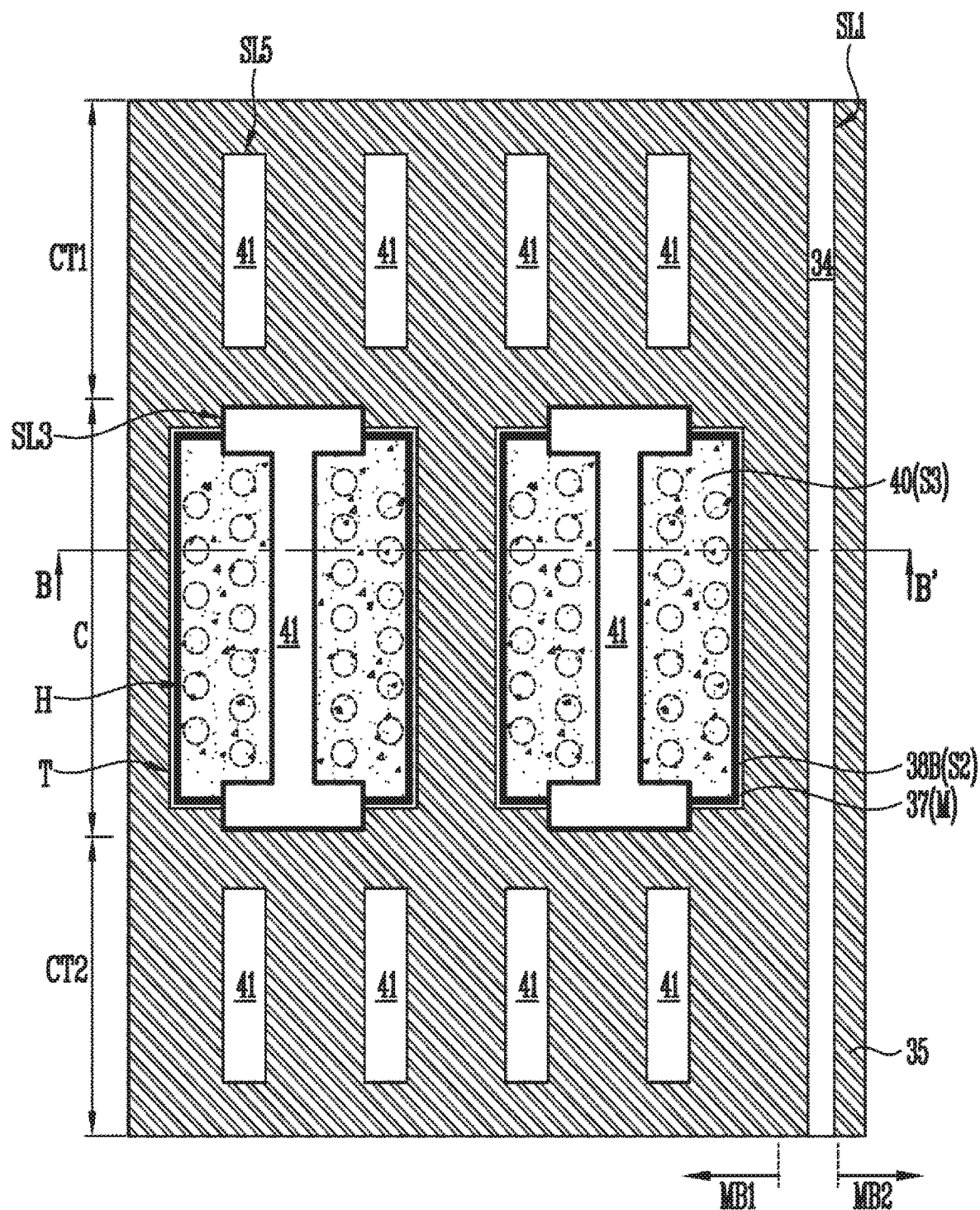
Figure 6B:
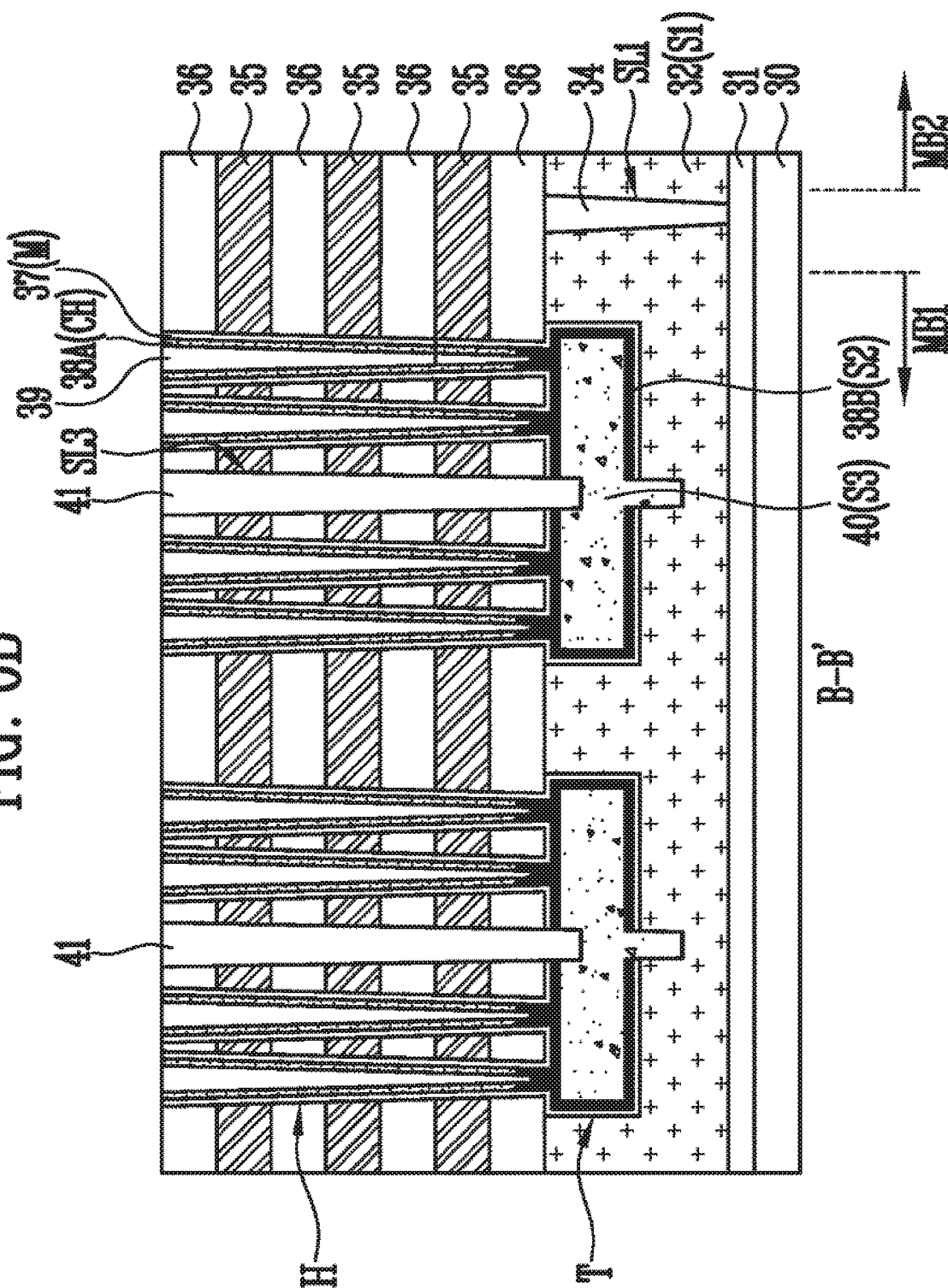

In FIG. 6a and FIG. 6b, a third source layer 40 is formed in the second source layer 38B and a low portion of the third slit SL3. For example, a barrier layer is formed along internal surfaces of the trench T, where the second source layer 38B is formed, and the third slit SL3, and a metal layer is formed on the barrier layer. Next, the third source layer 40 is formed by removing the barrier layer and the metal layer formed on the other area except the internal area of the first and the second source layers 32 and 38B. Here, the barrier layer may be one of a titanium Ti layer and a titanium nitride TiN layer, or combination of the layers, and the metal layer may be a tungsten W layer. In the event that the tungsten layer formed in the lower portion of the third slit SL3 and the tungsten layer formed in the second source layer 38B are separated while etching the barrier layer and the metal layer, the present invention may connect again the tungsten layers by growing the tungsten layers using a selective growth process.

Subsequently, an insulating layer 41 is formed in the third slit SL3. In this time, the fifth slits SL5 may be also filled with the insulating layer 41. Here, the insulating layer 41 may be an oxide layer formed by using a high temperature oxidation HTO process or a high density plasma HDP process, or be an oxide layer such as a spin on dielectric SOD or a polysilazane PSZ.

Next, the contact areas CT1 and CT2 are patterned to have step shape by etching the first and the second material layers 35 and 36, which are not shown. For example, a pair of the first and the second material layers 35 and 36 may be patterned to form one stairstep.

Figure 7A:
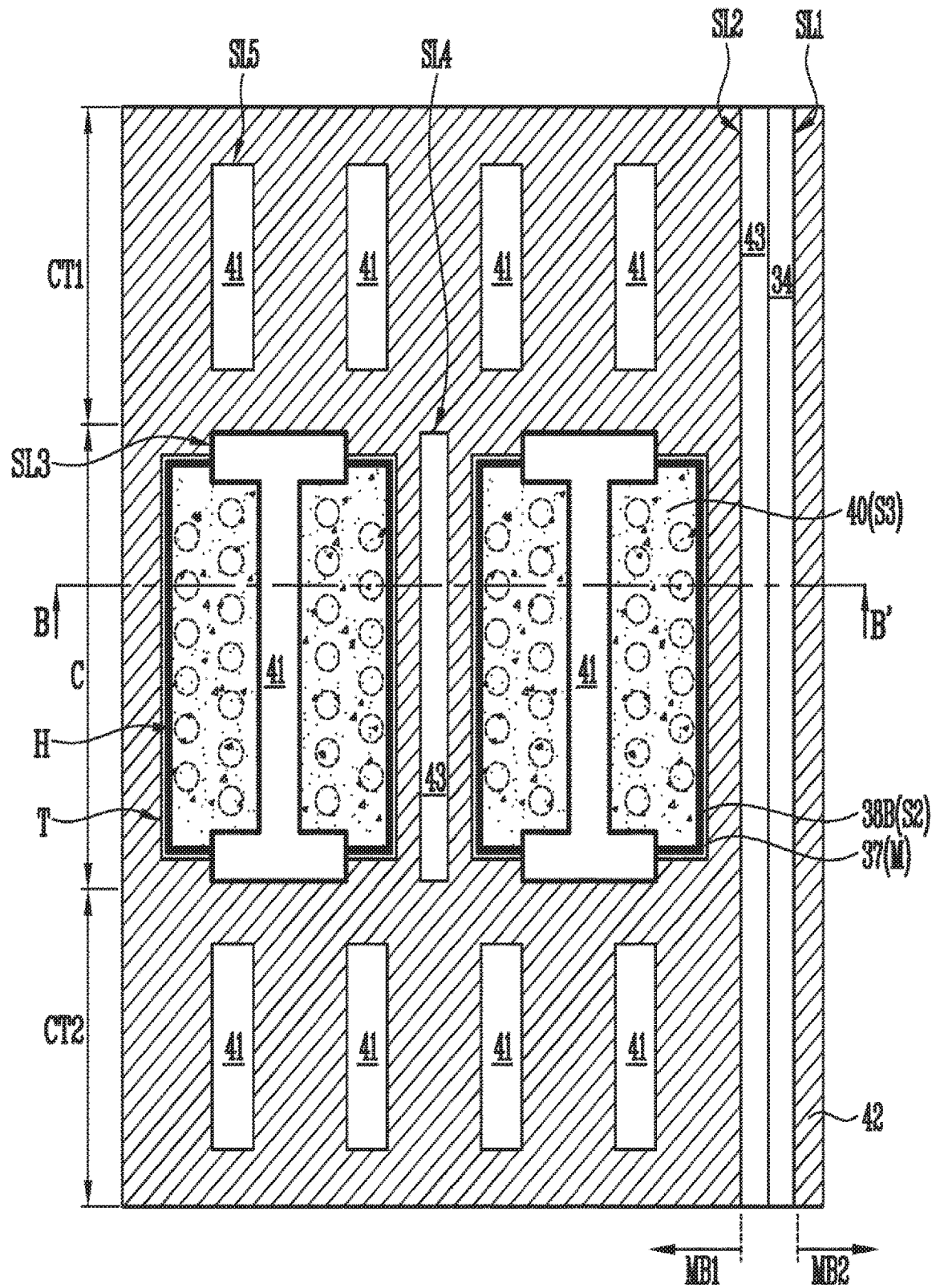
Figure 7B:
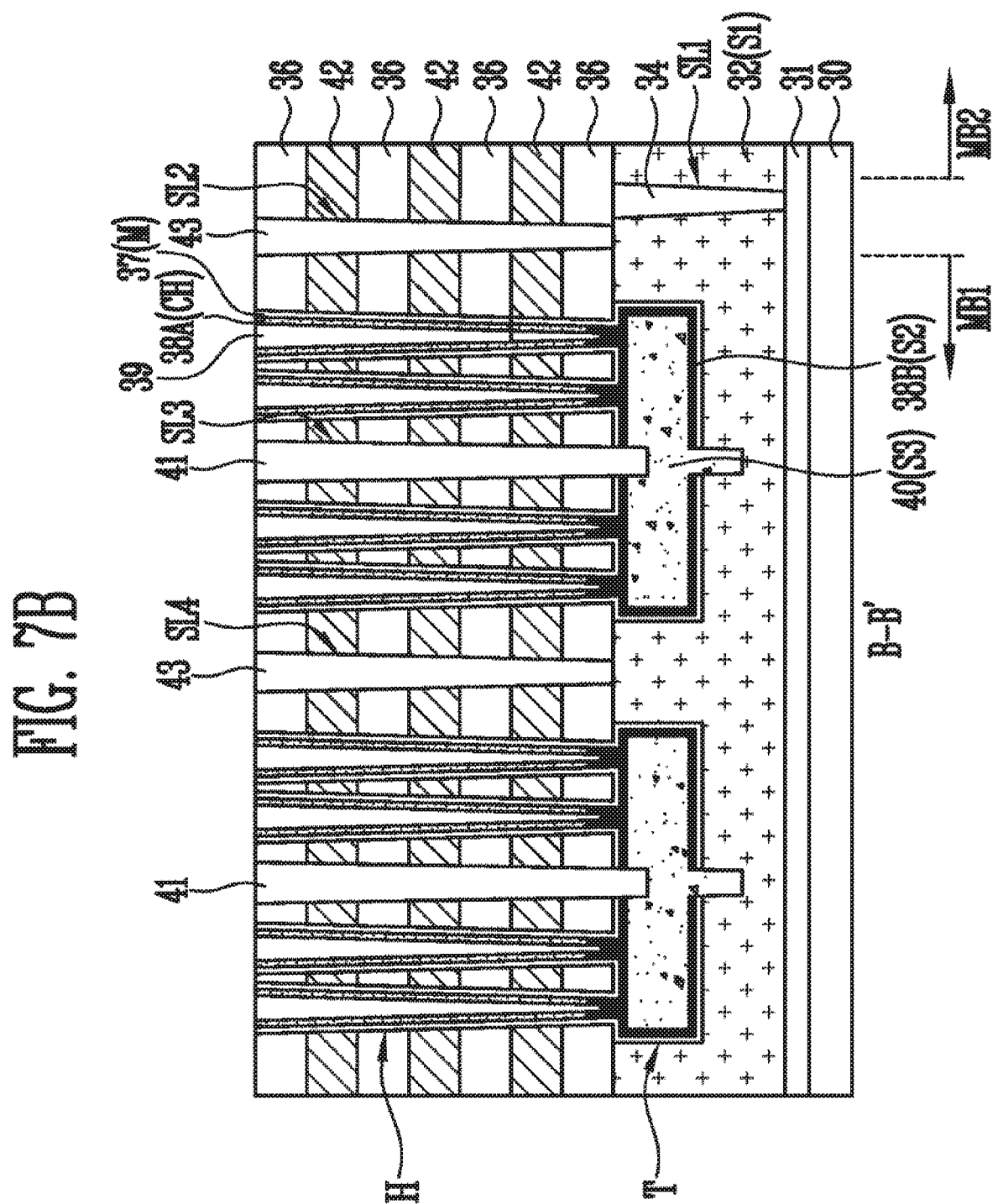

As shown in FIG. 7a and FIG. 7b, the second slit SL2 is formed by etching the first material layer 35 and the second material layer 36, it dividing the first material layer 35 and the second material layer 36 in the unit of the memory block MB1, MB2. Here, the second slit SL2 is formed with depth to expose every first material layer 35.

The second slit SL2 locates at a boundary of adjoining memory blocks MB1 and MB2, and is formed at a different location from the first slit SL1. In the event that the insulating layer 34 is exposed at a lower surface of the first slit SL1, the insulating layer 34 may be etched in a process of forming the second slit SL2. Accordingly, the second slit SL2 is formed at a different location from the first slit SL1, so that the insulating layer 34 is not etched.

One or more fourth slit SL4 may be also formed in the cell area C of each of the memory blocks MB1 and MB2 when the second slit SL2 is formed. The fourth slit SL4 may located between the channel layers 38A which do not share the second source layer S2, and may be formed at a depth to expose every first material layer 35.

At least one fifth slit SL5 (not shown) may be further formed in the contact area CT1 or CT2 of respective memory blocks MB1 and MB2 when the second slit SL2 is formed.

Subsequently, first recess regions may be formed by etching the first material layers 35 exposed in the second and the fourth slits SL2 and SL4. Since the first material layers 35 are etched under the condition that the third and the fifth slits SL3 and SL5 are filled with the insulating layer 41, the remaining second material layers 36 may be prevented from being slant or broken down.

Next, conductive layers 42 are formed in the first recess regions. For example, the conductive layers 42 are formed in the second and the fourth slits SL2 and SL4 so that the first recess regions are filled with the conductive layers 42, and then the conductive layers 42 in the first recess regions are divided by etching the conductive layers 42 formed on internal surfaces of the second and the fourth slits SL2 and SL4.

If the first slit SL1 and the second slit SL2 are overlapped, the insulating layer 34 in the first slit SL1 is etched while forming the second slit SL2. Accordingly, the conductive layer 42 is formed in the first slit SL1, and the conductive layer 42 formed in the first slit SL1 is not removed but remains. However, the first slit SL1 and the second slit SL2 are located differently, and thus the above phenomenon may be prevented.

Subsequently, an insulating layer 43 is formed in the second and the fourth slits SL2 and SL4. Additionally, it is possible to form air gap in the second and the fourth slits SL2 and SL4 by controlling deposition condition.

It is possible to form further a memory layer including an charge blocking layer, etc. in the first recess regions before the conductive layer 42 is formed. In addition, it is possible to form further the fifth slit SL5 when forming the second slit SL2. In this case, the first material layers 35 exposed in the second, the fourth and the fifth slits SL2, SL4 and SL5 are etched, and then the insulating layer 43 is formed in the second, the fourth and the fifth slits SL2, SL4 and SL5.

Figure 8A:
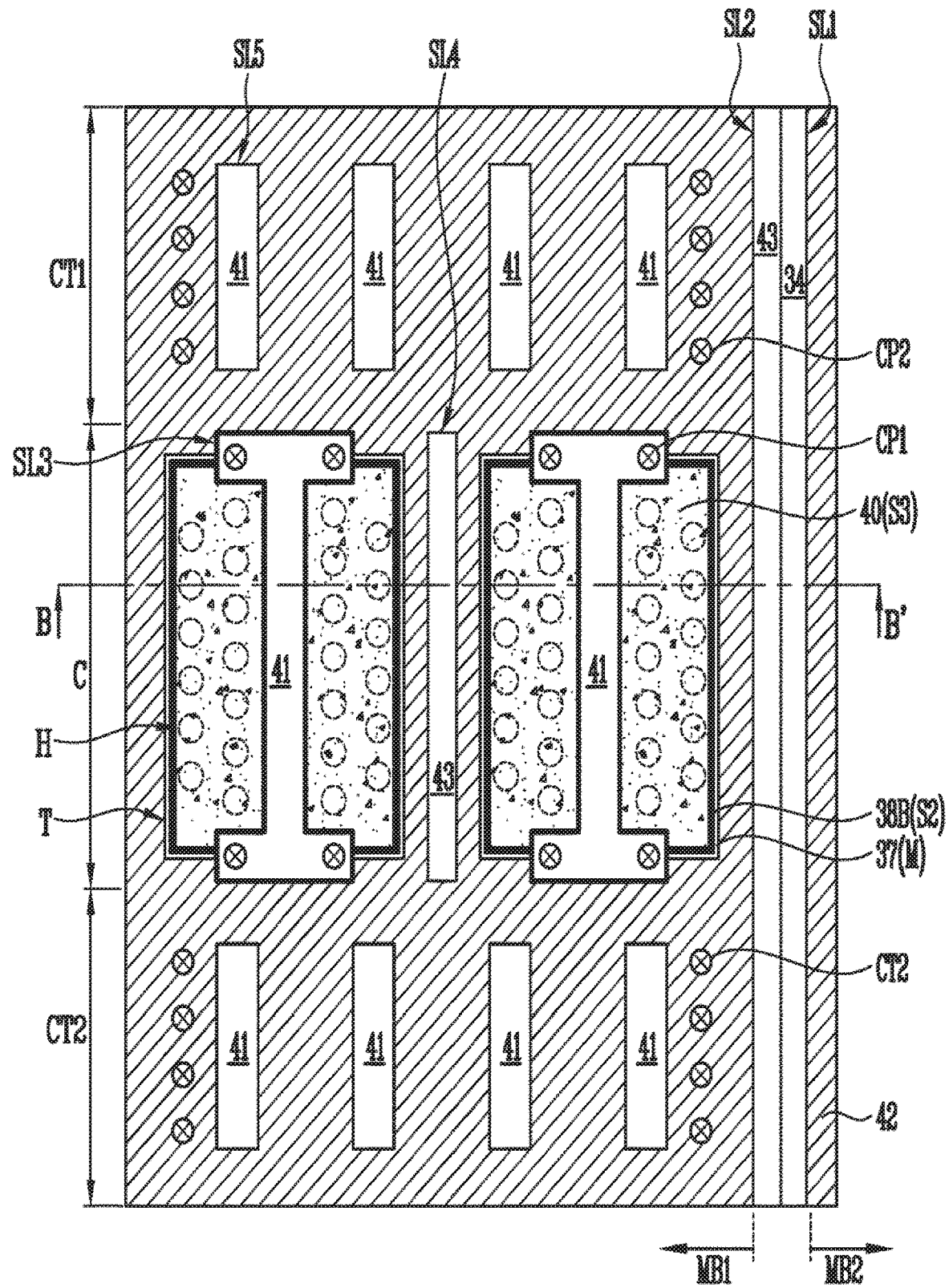

In FIG. 8a and FIG. 8b, one or more first contact plug CP1 connected to the third source layer 40 through the third slit SL3 is formed. Second contact plugs CP2 are formed in the contact areas CT1 and CT2, they being connected to the conductive layers 42, respectively.

The semiconductor device including the first to the third source layers 32, 38B and 40 is manufactured through the above process. The memory layer 37 is formed along the internal surfaces of the trench T and the channel holes H, and then the second source layer 38B, the third source layer 40 and the channel layers 38A are formed in the memory layer 37. Accordingly, an etching process for exposing a source layer of a lower surface of the channel holes is not needed, and so the level of difficulty of the process of manufacturing the semiconductor device may be lowered.

Some of the above processes may be changed according to kind of the first material layer 35 and the second material layer 36. Especially, some of a process performed after the process of forming the second and the fourth slits SL2 and SL4 may be changed.

In an embodiment, in the event that the first material layer 35 is formed with a conductive layer and the second material layer 36 is formed with an interlayer dielectric layer, the first material layers 35 exposed at the second and the fourth slits SL2 and SL4 may be silicided. Next, the second and the fourth slits SL2 and SL4 are filled with the insulating layer 43.

In other embodiments, in the event that the first material layer 35 is formed with a conductive layer and the second material layer 36 is formed with a sacrificial layer, second recess regions are formed by etching selectively the second material layers 36 exposed at the second and the fourth slits SL2 and SL4. Subsequently, the first material layers 35 exposed at the second and the fourth slits SL2 and SL4 are silicided, and the second recess regions, the second slit SL2 and the fourth slit SL4 are filled with the insulating layer 43.

The method of manufacturing the semiconductor device according to the first embodiments is described above. Semiconductor devices according to second embodiments to the fourth embodiments may be manufactured by using the first embodiments. The semiconductor device of the second embodiments may be manufactured by adjusting the depth of the third slit SL3. The semiconductor device of the third embodiments may be manufactured by omitting steps of forming the trench T, the sacrificial layer 33, the third slit SL3, the second and the third source layers 38B and 40, etc. The semiconductor device of the fourth embodiments may be manufactured by forming the trench to connect a pair of channel holes and omitting steps of forming the third slit SL3, the second and the third source layers 38B and 40, etc.

Figure 9A:
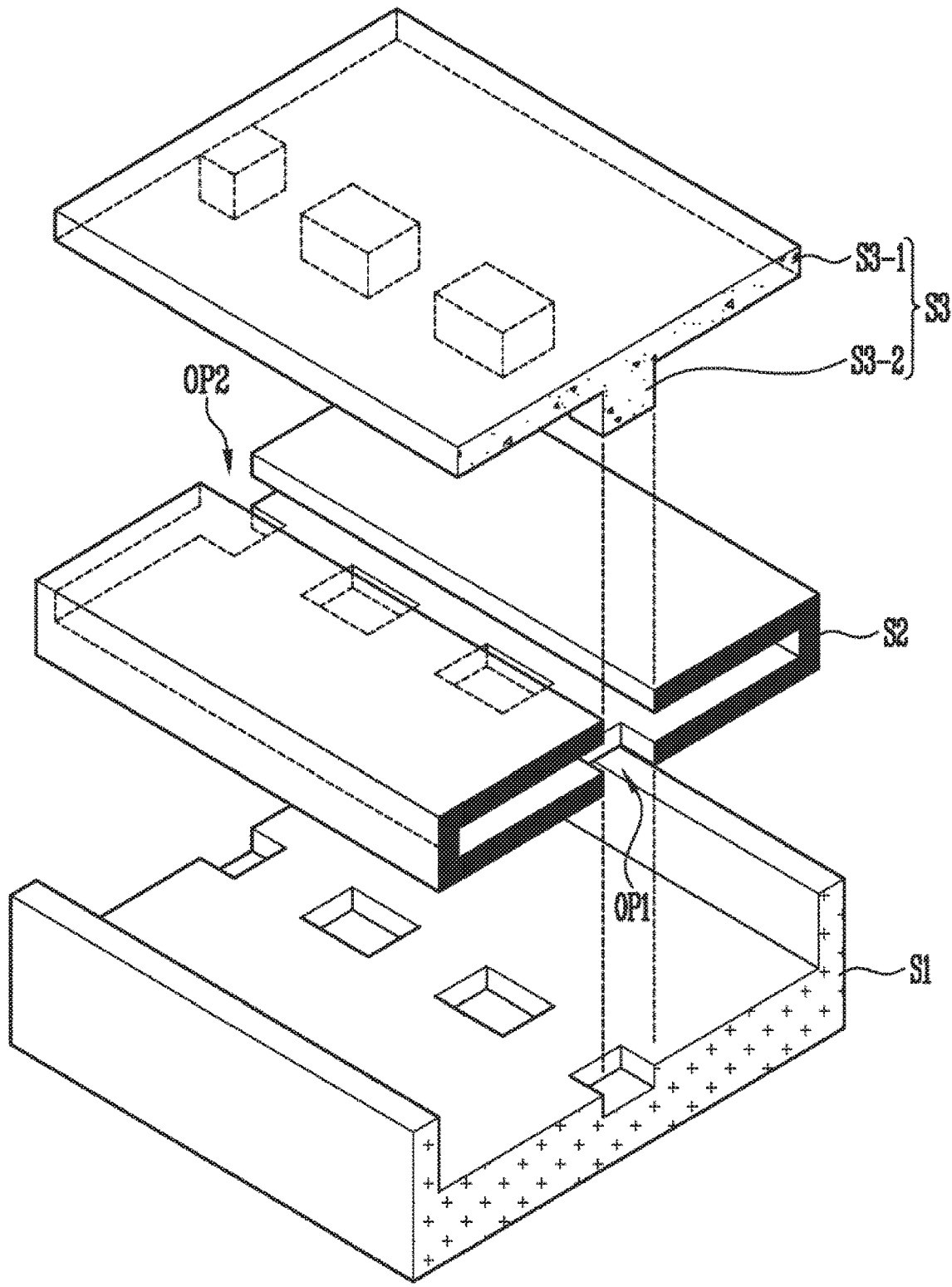
FIG. 9a and FIG. 9b are perspective views illustrating a source layer of a semiconductor device according to first embodiments of the present invention.
Figure 9B:
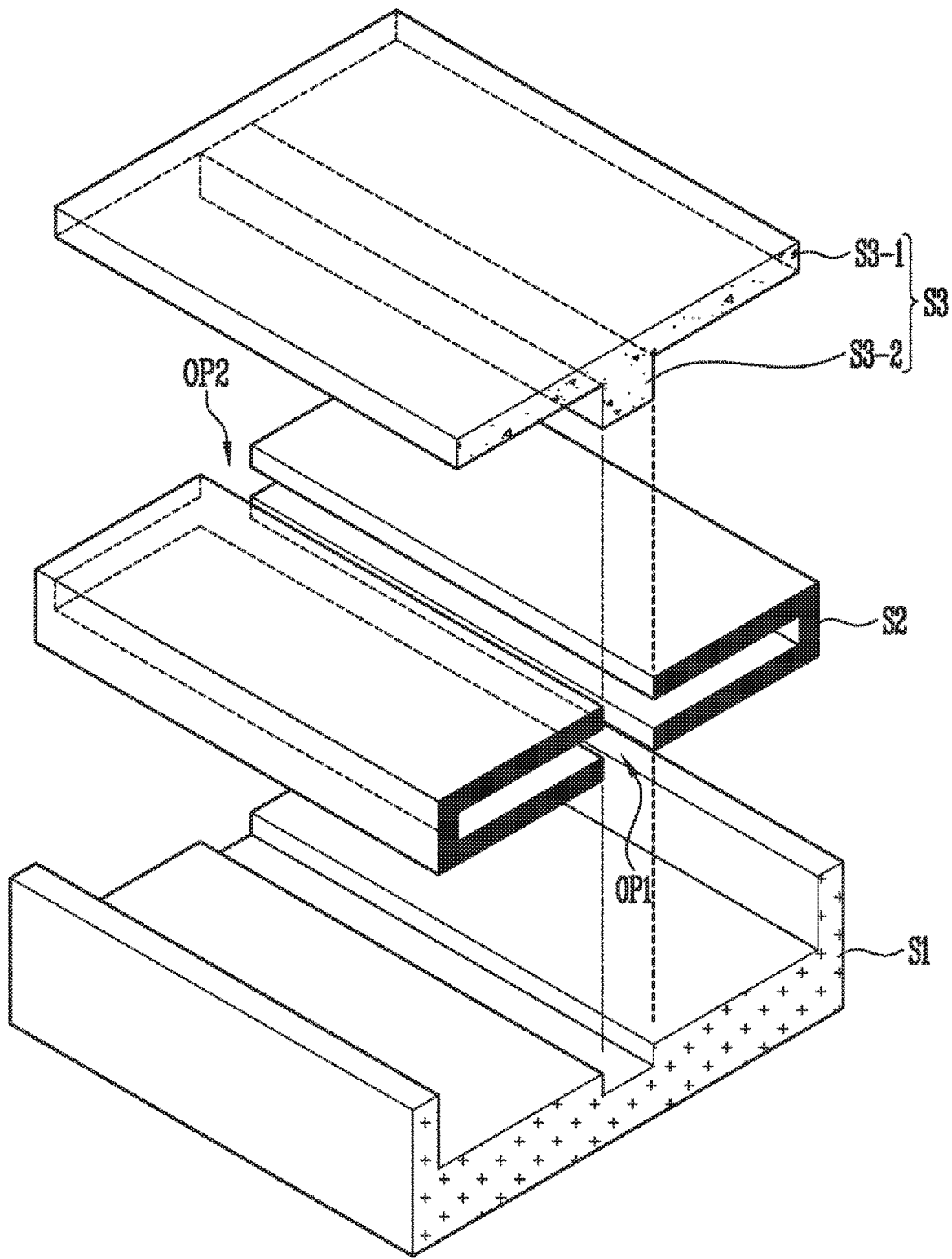

FIG. 9a and FIG. 9b are perspective views illustrating a source layer of a semiconductor device according to first embodiments of the present invention.

As shown in FIG. 9a and FIG. 9b, a second source layer S2 is formed in a first source layer S1, and the first source layer S1 surrounds sides and a lower surface of the second source layer S2. In addition, a third source layer S3 is formed in the second source layer S2, and the second source layer S2 surrounds an upper surface, a side and a lower surface of the third source layer S3.

The second source layer S2 includes at least one first open part OP1 formed at its lower surface and one or more second open part OP2 formed at its upper surface. The first open part OP1 may have island shape, the first open parts OP1 being separately disposed with constant space as shown in FIG. 9a. The first open part OP1 may have line shape as shown in FIG. 9b. The second open part OP2 may have line shape, and be overlapped with the first open part OP1.

The third source layer S3 includes a plate layer S3-1 in the second source layer S2 and at least one project layer S3-2 projected from a lower surface of the plate layer S3-1. The project layer S3-2 may have island shape as shown in FIG. 9a or line shape as shown in FIG. 9b, and correspond to the first open part OP1 of the second source layer S2. Accordingly, the project layer S3-2 is directly connected to the first source layer S1 through the first open part OP1 of the second source layer S2.

FIG. 10a to FIG. 10g are views illustrating layouts of a semiconductor device according to first embodiments of the present invention. As shown in FIG. 10a to FIG. 10g, the semiconductor device of the present embodiments may include a first and a second slits SL1 and SL2 located at a boundary of adjoining memory blocks, a third and a fourth slits SL3 and SL4 disposed in a cell area of respective memory block and fifth slits SL5 located in a contact area in each of the memory blocks. The first slit SL1 is formed at different location from the second slit SL2. The first to the fifth slits SL1~SL5 may be simultaneously formed or be dividedly formed.

Hereinafter, various shapes and manufacturing methods of the fifth slit SL5 formed in the contact area will be described in detail with reference to FIG. 10a to FIG. 10g. FIGs show a part of a channel of adjoining memory blocks, for easy comprehension.

Figure 10A:
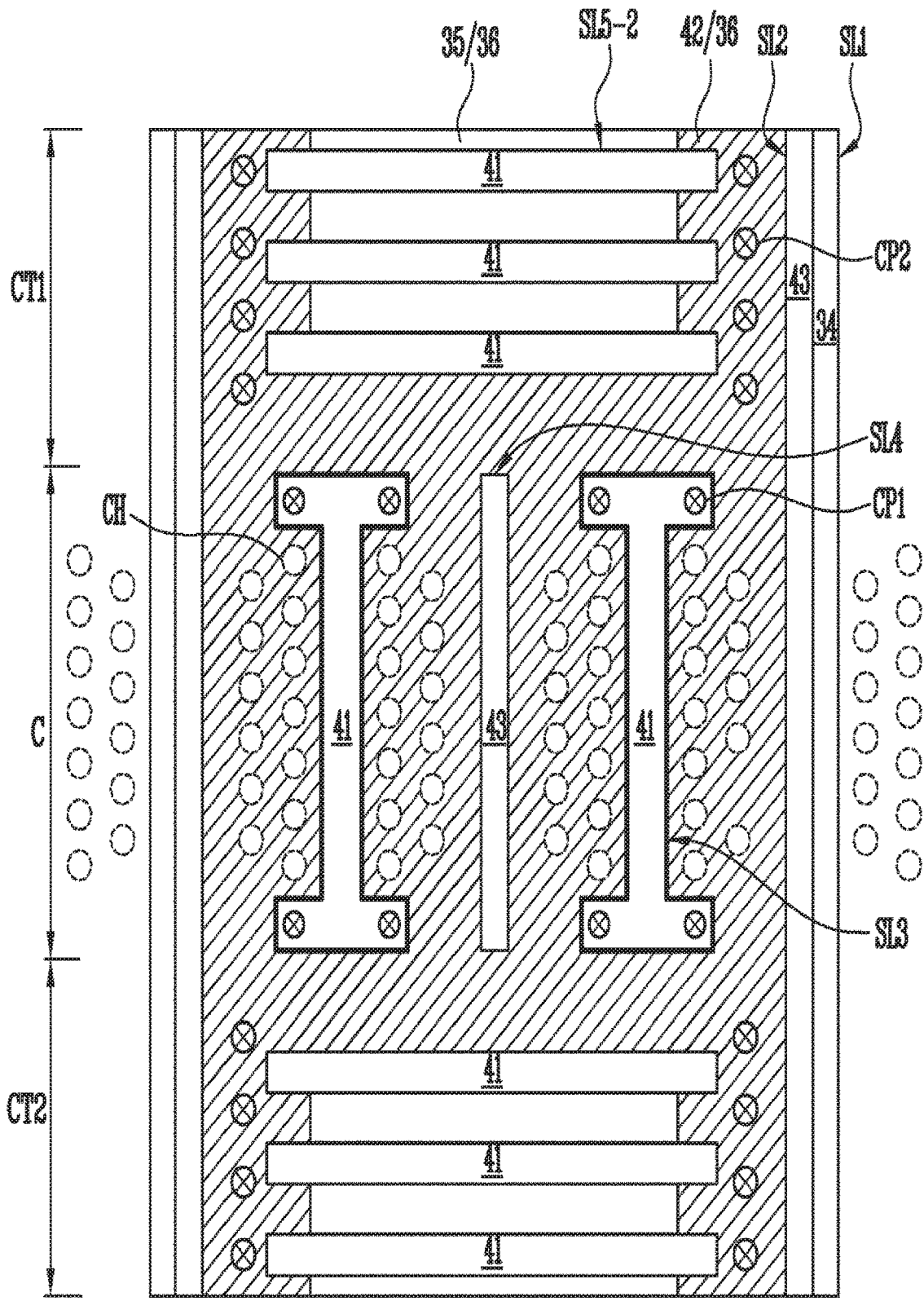
FIG. 10a to FIG. 10g are views illustrating layouts of a semiconductor device according to first embodiments of the present invention.

As shown in FIG. 10a, respective fifth slits SL5 may have line shape extended substantially in parallel in one direction. Particularly, the fifth slits SL5 may be formed in central areas of the contact areas CT1 and CT2, and have the line shape in the cross direction of the first and the second slits SL1 and SL2.

Figure 10B:
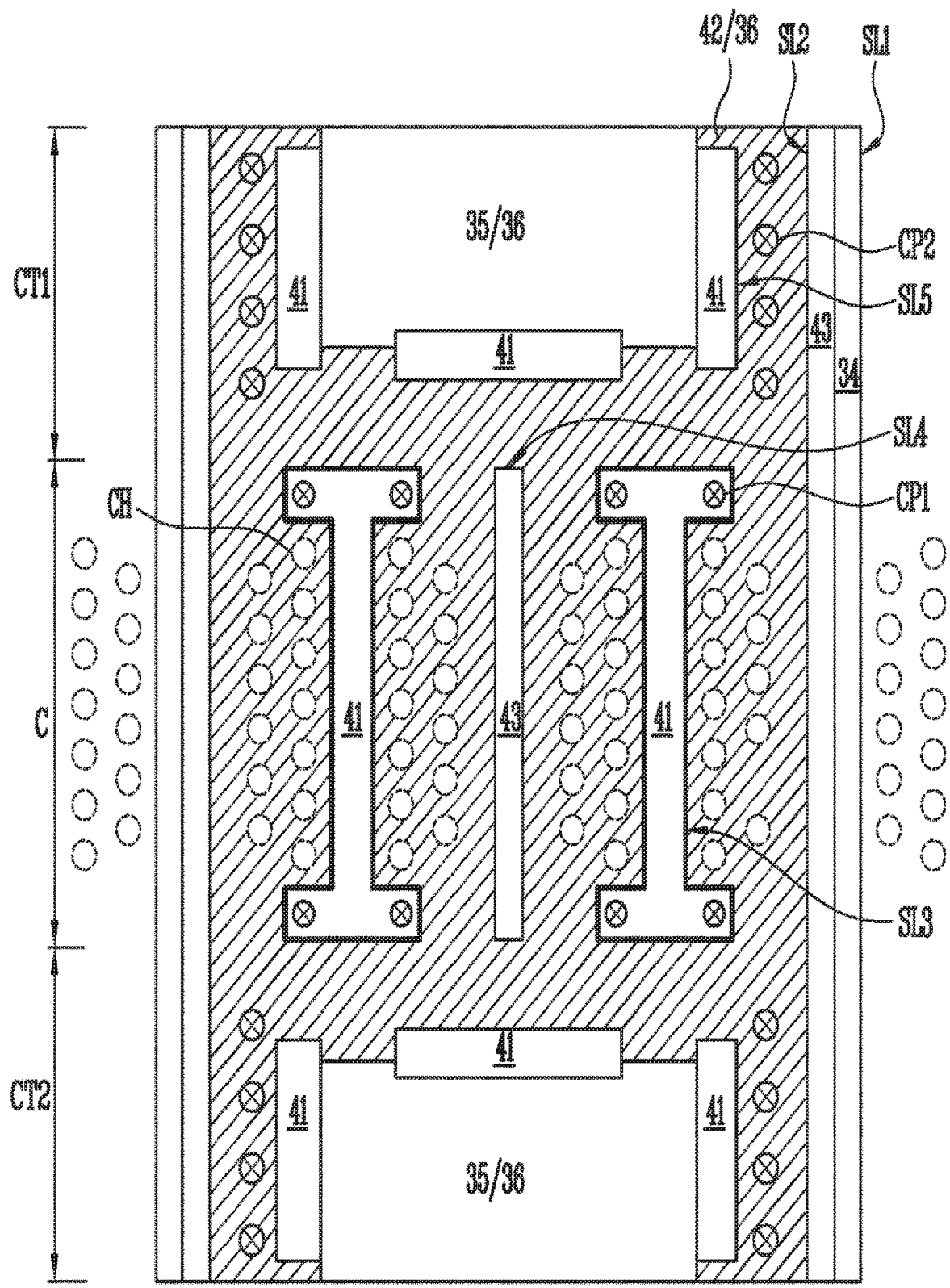

As shown in FIG. 10b, the fifth slits SL5 may substantially have "c" shape. Particularly, the fifth slits SL5 may be formed at edge of the contact areas CT1 and CT2, and be formed with separated lines or with one line.

Figure 10C:
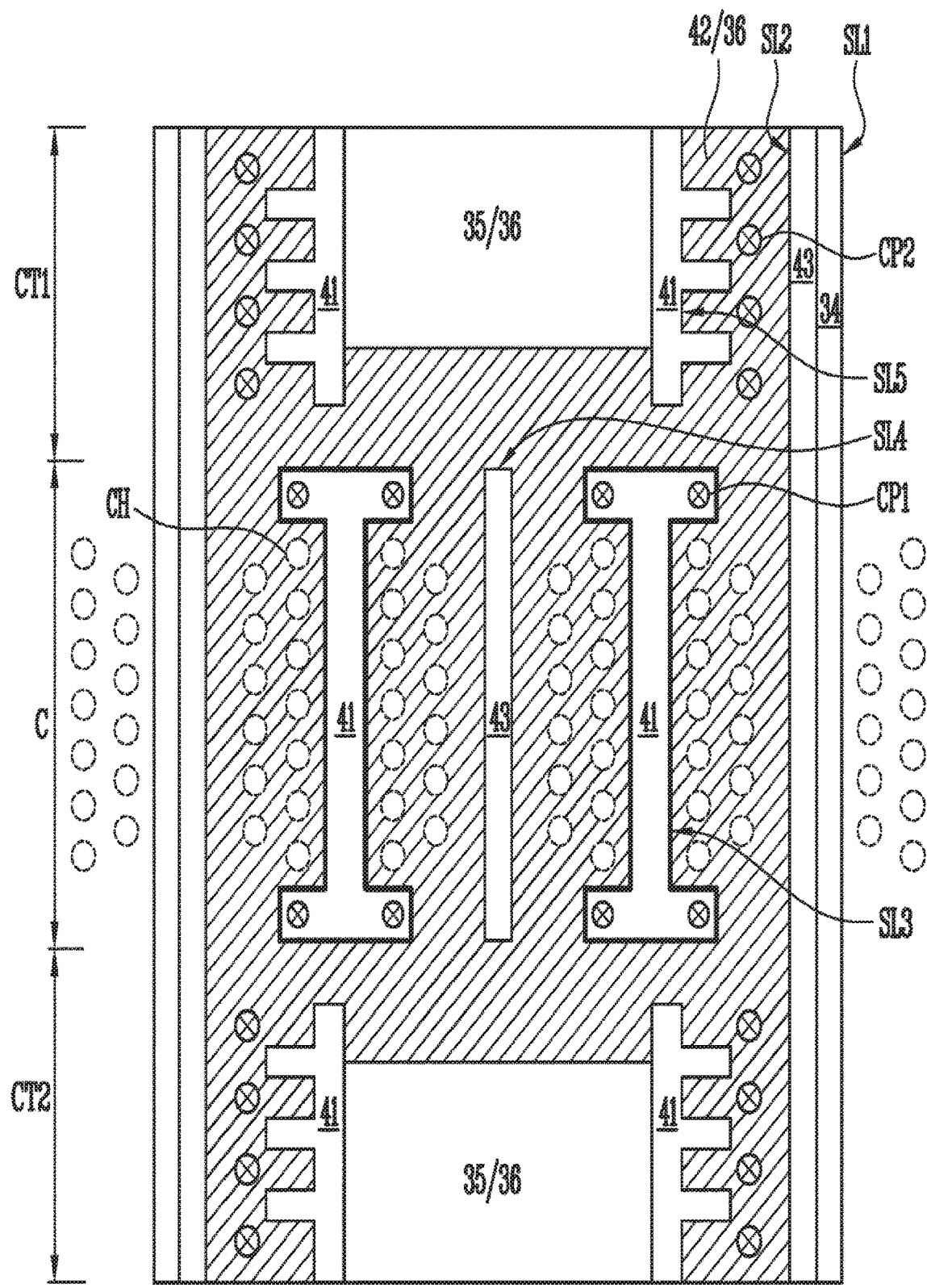

As shown in FIG. 10c, the fifth slits SL5 may include a line part extended in one direction and projecting parts projected from the line part (or for example a line shape). The projecting parts may be formed at both of sides or one side of the line part, and second contact plugs CP2 may be located between the projecting parts. The fifth slits SL5 may be located at an edge of the contact areas CT1 and CT2, and be formed symmetrically or asymmetrically.

Forming order of the slits in the semiconductor device having layouts shown in FIG. 10a to FIG. 10c is as follows. The third and the fifth slits SL3 and SL5 are formed, and then they are filled with the insulating layer 41. Subsequently, the second and the fourth slits SL2 and SL4 are formed and the first material layers 35 are replaced with the conductive layer 42. Since a process of replacing the first material layers 35 with the conductive layer 42 is performed under the condition that the fifth slits SL5 are filled with the insulating layer 41, a part of the first material layers 35 may remain in the contact areas CT1 and CT2, according to a location and shape of the fifth slit SL5. That is, the first material layers 35 and the second material layers 36 may be stacked in turn in a part of the contact areas CT1 and CT2, for example central area, and the conductive layers 42 and the second material layers 36 may be stacked alternatively in the other part of the contact areas CT1 and CT2, e.g. edge and the cell area C.

Figure 10D:
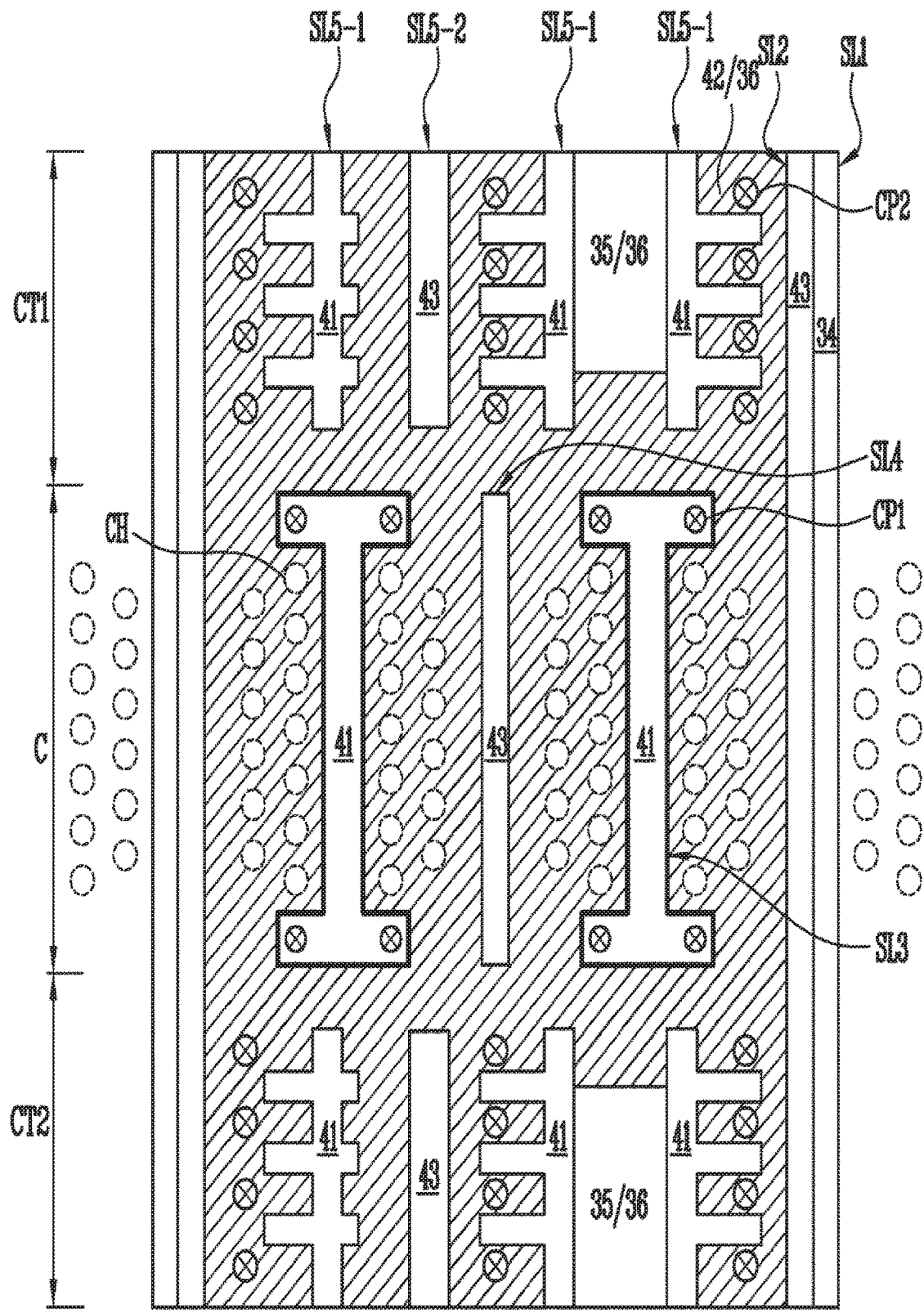

As shown in FIG. 10d, the fifth slits may include slits SL5-1 having line shape and slits SL5-2 having line shape, the slits SL5-1 including a projecting part and the slits SL5-2 being formed between the slits SL5-1. The slits SL5-1 may have substantially the same shape, or some of the slits SL5-1 may have substantially symmetrical shapes and the other slits SL5-1 may have different shapes. The slits SL5-2 may be formed between some of the slits SL5-1.

Figure 10E:
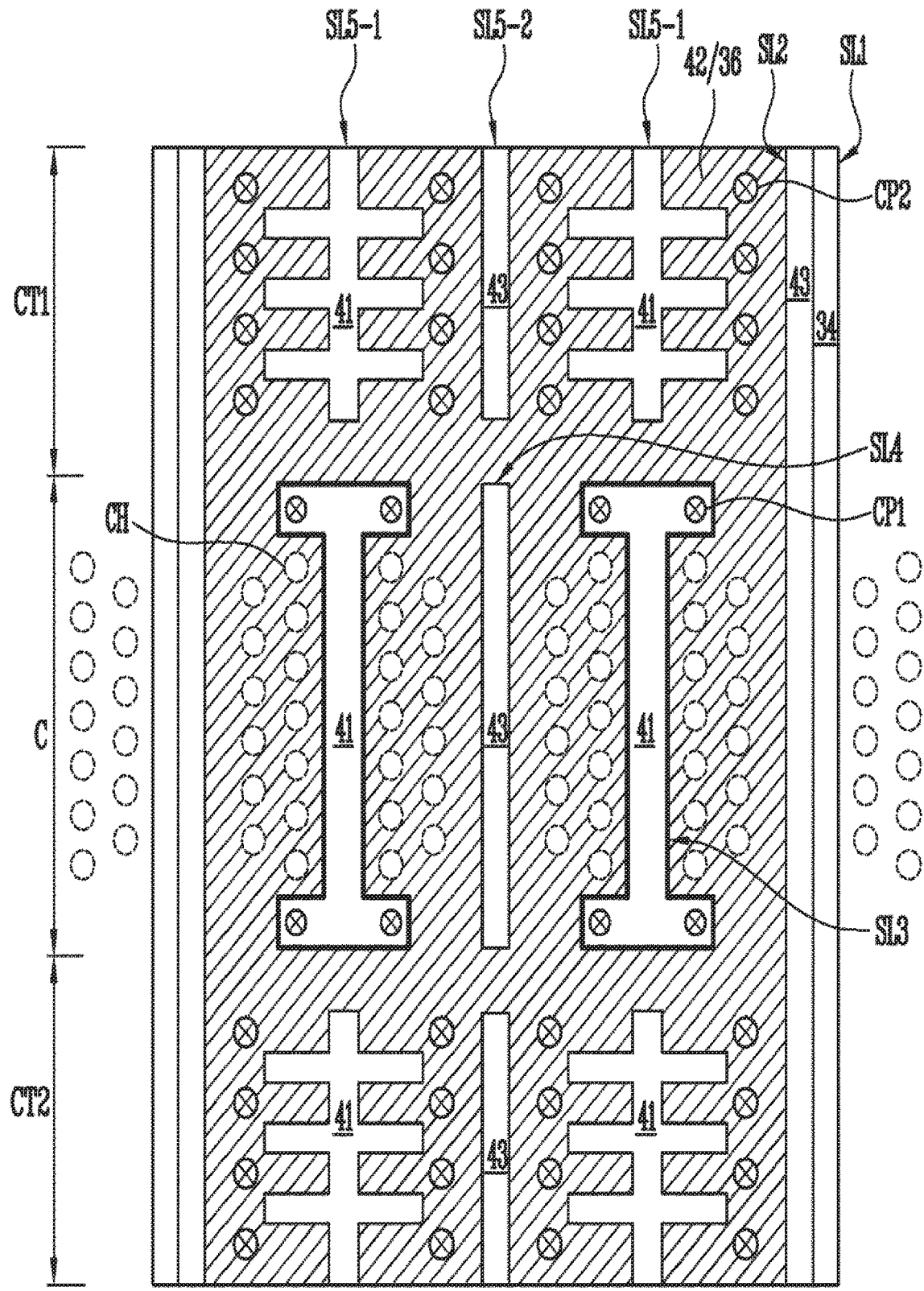

As shown in FIG. 10e, the fifth slits may include slits SL5-1 and slits SL5-2 formed with line shape between the slits SL5-1, the slits SL5-1 including a line part extended in one direction and projecting parts projected from both of sides of the line part. The fifth slits SL5-1 and SL5-2 may have fish bone shape. The slits SL5-2 may be formed between every one of the slits SL5-1.

Figure 10F:
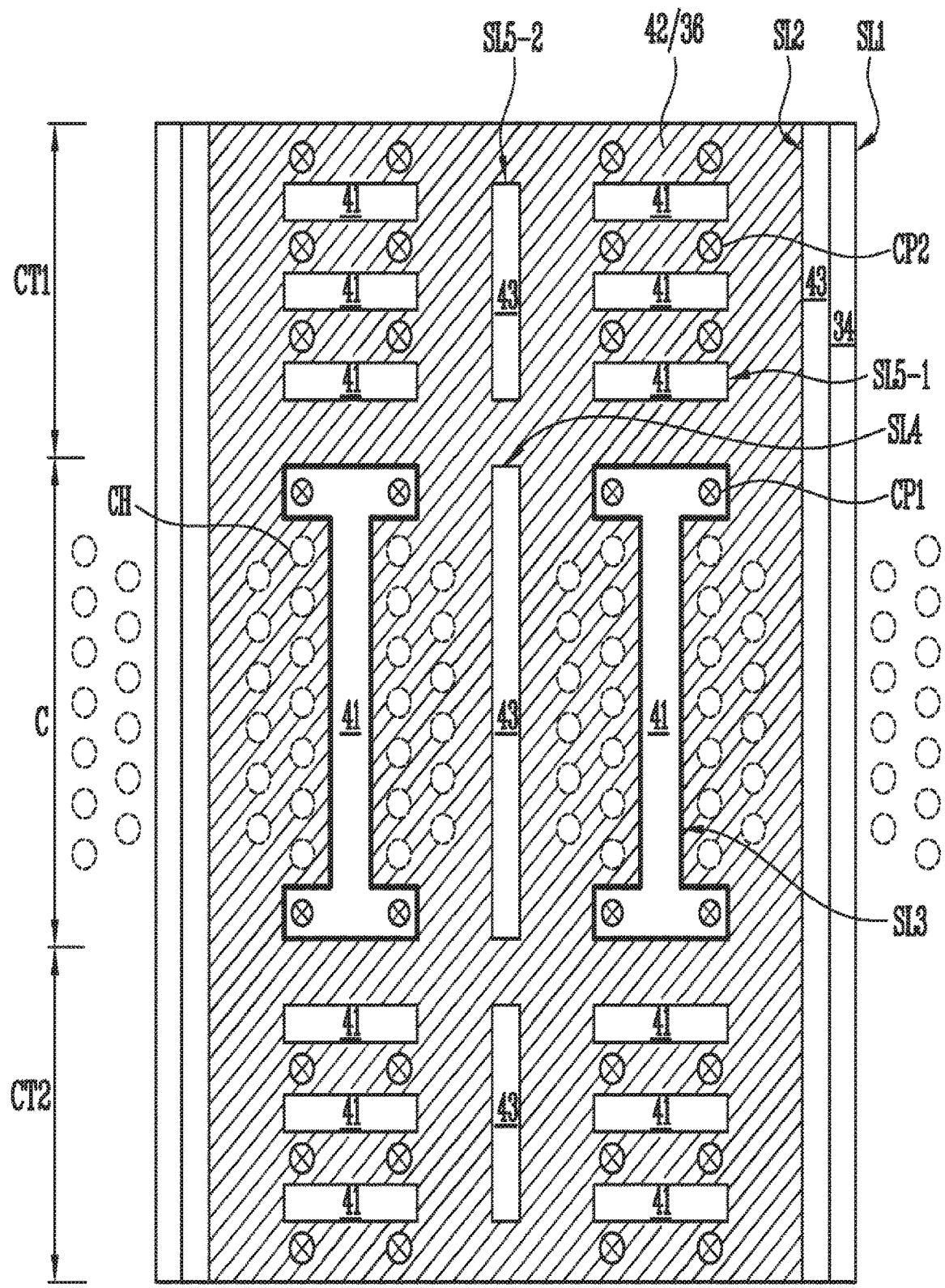

As shown in FIG. 10f, the fifth slits may include slits SL5-1 extended with line shape in one direction and slits SL5-2 formed between the slits SL5-1 in different direction from the slits SL5-1. The slits SL5-1 may have substantially the same length. The slits SL5-1 may be extended in the cross area of the first and the second slits SL1 and SL2, and the slits SL5-2 may be extended in substantially the same direction as the first and the second slits SL1 and SL2. Especially, the slits SL5-2 may be formed in substantially the same line as the fourth slit SL4.

Figure 10G:
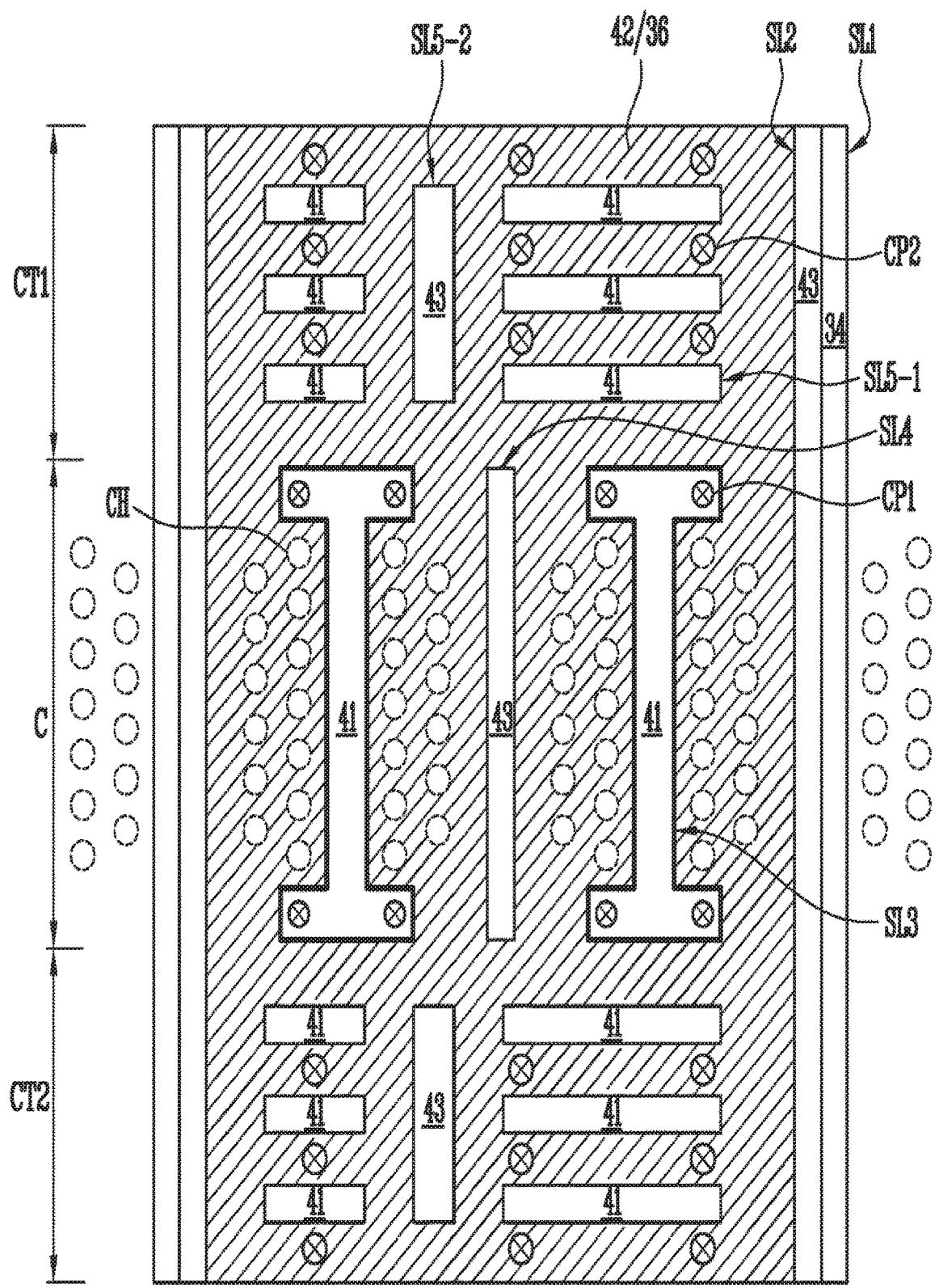

As shown in FIG. 10g, the fifth slits may include slits SL5-1 extended with a line shape in one direction and slits SL5-2 formed between the slits SL5-1 in different direction from the slits SL5-1. The slits SL5-1 may have different length. The slits SL5-2 may be extended in substantially the same direction as the fourth slit SL4, and be disposed staggered from the fourth slit SL4.

Forming order of the slits in the semiconductor device having layouts shown in FIG. 10d to FIG. 10g is as follows. The slits SL3 and SL5-1 are formed and then are filled with the insulating layer 41. The slits SL2, SL4 and SL5-2 are formed and the first material layers 35 are replaced with the conductive layer 42, under the condition that the slits SL3 and SL5-1 are filled with the insulating layer 41.

As a result, the first material layers 35 are replaced with the conductive layers 42 in an area, where the slit SL5-2 is formed, of the contact areas CT1 and CT2, and thus the conductive layers 42 and the second material layers 36 are stacked in the area. The first material layers 35 remain in an area, where the slit SL5-2 is not formed, of the contact areas CT1 and CT2, and so the first material layers 35 and the second material layers 36 are stacked in the area. Accordingly, the second contact plugs CP2 may be formed at a central area as well as an edge of the contact areas CT1 and CT2.

Figure 11:
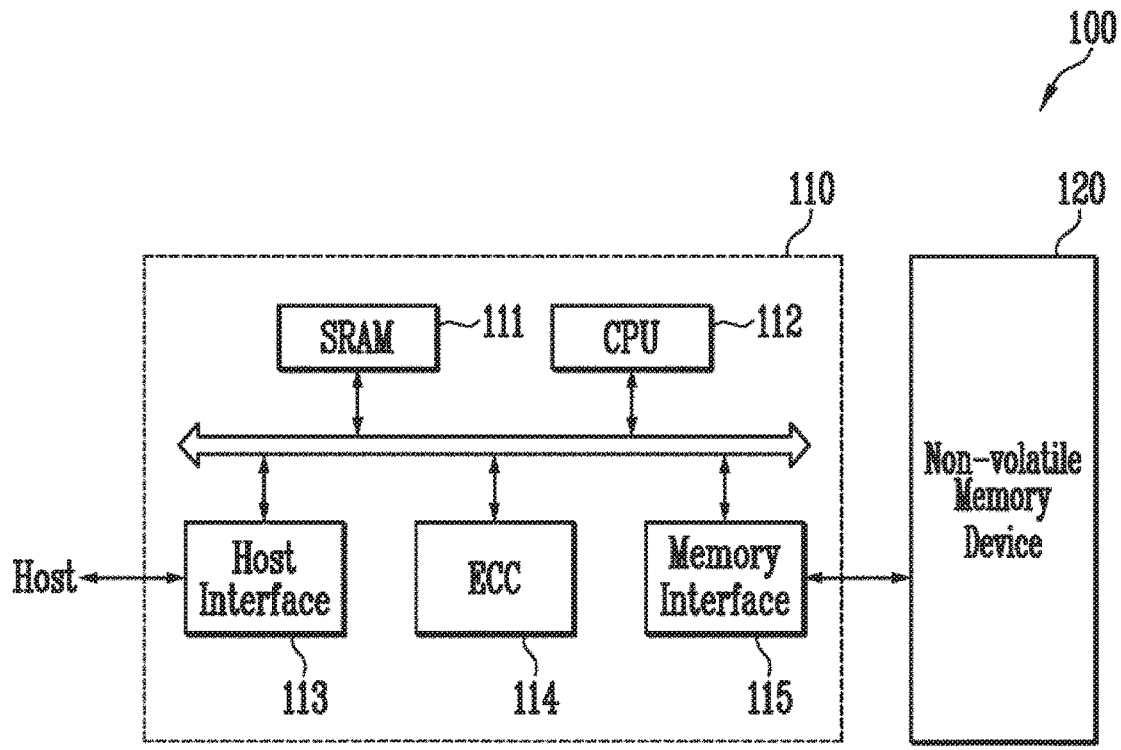
FIG. 11 is a block diagram illustrating a memory system according to an embodiment of the present invention.

FIG. 11 is a block diagram illustrating a memory system according to an embodiment of the present invention.

In FIG. 11, a memory system 100 of the present embodiments may include a non-volatile memory device 120 and a memory controller 110.

The non-volatile memory device 120 may have the structure in accordance with the above layout. The non-volatile memory device 120 may be a multi-chip package including flash memory chips.

The memory controller 110 controls the non-volatile memory device 120, and may include a SRAM 111, a CPU 112, a host interface 113, an ECC 114 and a memory interface 115. The SRAM 111 is used as an operation memory of the CPU 112. The CPU 112 performs control operation for data exchange of the memory controller 110, and the host interface 113 has data exchange protocol of a host accessed to the memory system 100. The ECC 114 detects and corrects error of data read from the non-volatile memory device 120, and the memory interface 115 interfaces with the non-volatile memory device 820 of the present invention. The memory controller 110 may further include a ROM for storing code data for interfacing with the host and so on.

The memory system 100 may be a memory card including the non-volatile memory device 120 and the memory controller 110 or a solid state disk SSD. For example, the memory controller 110 communicates with an external device, e.g. host through one of various interface protocols such as USB, MMC, PCI-E, SATA, PATA, SCSI, ESDI, IDE, etc.

Figure 12:
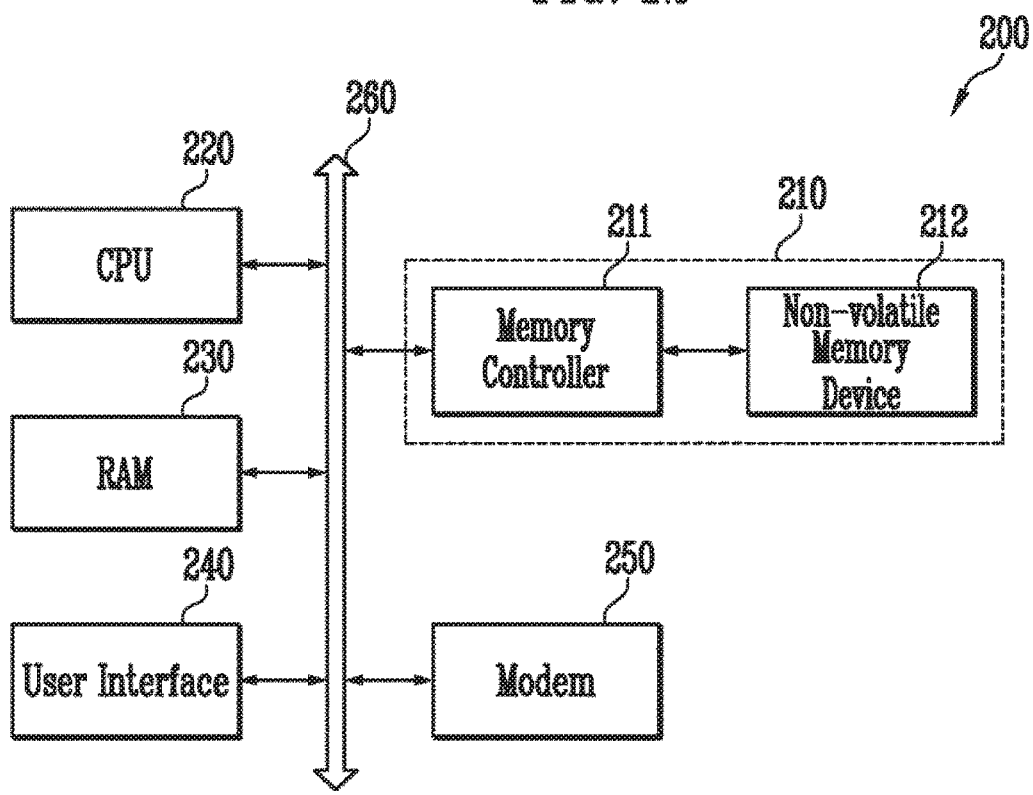
FIG. 12 is a view illustrating a computing system according to an embodiment of the present invention.

FIG. 12 is a view illustrating a computing system according to an embodiment of the present invention.

In FIG. 12, a computing system 200 of the present invention includes a CPU 220 connected electrically to a system bus 260, a RAM 230, a user interface 240, a modem 250 and a memory system 210. In case that the computing system 200 is a mobile device, a battery for supplying an operation voltage to the computing system 200 may be further provided. The computing system 200 may further include an application chipset, a CMOS image sensor CIS, a mobile DRAM, etc.

The memory system 210 may include a non-volatile memory device 212 and a memory controller 211, as described in FIG. 11.

In above description, the structure and manufacturing method of the non-volatile memory device are described, but the present invention is not limited as the non-volatile memory device. The present invention may be applied to any semiconductor device including stacked conductive layers and slits for dividing the conductive layers in the unit of the memory block, for example a volatile memory device and the non-volatile memory device, etc.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of manufacturing a semiconductor device, the method comprising:
   forming a first slit through a first conductive layer;
   forming a first slit insulating layer in the first slit;
   alternately forming first material layers and second material layers;
   forming channel layers of a memory block through the first material layers and the second material layers, wherein the first slit is located at one side of the channel layers;
   forming a second slit through the first material layers and the second material layers at the one side of the channel layers so that no channel layers are located between the first slit and the second slit, wherein the second slit does not overlap the first slit in a stacking direction of the first and second material layers;
   forming recess regions by removing the first material layers exposed in the second slit;
   forming second conductive layers in the recess regions; and
   forming a second slit insulating layer in the second slit, wherein a bottom of the second slit and a top of the first slit are located at substantially the same level.

2. The method of claim 1, wherein a bottom of the second slit insulating layer and a top of the first slit insulating layer are located at substantially the same level.

3. The method of claim 1, wherein a lower surface of the second slit insulating layer directly contacts the first conductive layer.

4. The method of claim 1, wherein the second slit is formed to expose the first conductive layer.

5. The method of claim 1, wherein the first slit and the second slit are located between a first memory block and a second memory block adjacent to the first memory block.

6. The method of claim 1, wherein the first conductive layer is a pipe gate, at least one uppermost first material layer is a first material layer for a selection line, and the other first material layers are first material layers for a word line.

7. The method of claim 1, wherein the first conductive layer is a first source layer, at least one uppermost first material layer is a first material layer for an upper selection line, at least one lowermost first material layer is a first material layer for a lower selection line, and the other first material layers are first material layers for a word line.

8. The method of claim 1, wherein a lower surface of the second slit insulating layer and an upper surface of the first slit insulating layer are coplanar and spaced apart from each other.

9. The method of claim 1, further comprising:
   forming a third slit through the first material layers and the second material layers and exposing the first conductive layer, wherein the third slit is located at an other side of the channel layers.

10. The method of claim 9, wherein the channel layers are located between the second slit and the third slit.

11. The method of claim 1, wherein an upper surface of the first slit insulating layer contacts a lower surface of a lowermost second material layer among the second material layers.

12. A method of manufacturing a semiconductor device, the method comprising:
    forming a first slit through a first conductive layer;
    forming a first slit insulating layer in the first slit;
    alternately forming first material layers and second material layers;
    forming channel layers of a memory block through the first material layers and the second material layers, wherein the first slit is located at one side of the channel layers;
    forming a second slit through the first material layers and the second material layers at the one side of the channel layers so that no channel layers are located between the first slit and the second slit, wherein the second slit does not overlap the first slit in a stacking direction of the first and second material layers;
    forming a third slit through the first material layers and the second material layers and exposing the first conductive layer, wherein the third slit is located at an other side of the channel layers;
    forming recess regions by removing the first material layers through the second slit;
    forming second conductive layers in the recess regions; and
    forming a second slit insulating layer in the second slit, wherein a lower surface of the second slit insulating layer directly contacts the first conductive layer.

13. The method of claim 12, wherein the second slit is formed to expose the first conductive layer.

14. The method of claim 12, wherein the first slit and the second slit are located between a first memory block and a second memory block adjacent to the first memory block.

15. The method of claim 12, wherein the first conductive layer is a first source layer, at least one uppermost first material layer is a first material layer for an upper selection line, at least one lowermost first material layer is a first material layer for a lower selection line, and the other first material layers are first material layers for a word line.

16. The method of claim 12, wherein the first conductive layer is a pipe gate, at least one uppermost first material layer is a first material layer for a selection line, and the other first material layers are first material layers for a word line.

17. A method of manufacturing a semiconductor device, the method comprising:
    forming a first slit insulating layer through a first conductive layer;
    alternately forming first material layers and second material layers;
    forming channel layers of a memory block through the first material layers and the second material layers, wherein the first slit insulating layer is located at one side of the channel layers;

forming a second slit through the first material layers and the second material layers at the one side of the channel layers so that no channel layers are located between the first slit insulating layer and the second slit, wherein the second slit does not overlap the first slit insulating layer in a stacking direction of the first and second material layers;

forming recess regions by removing the first material layers through the second slit; and forming second conductive layers in the recess regions, wherein the second slit is formed to expose the first conductive layer.

\* \* \* \* \*